United States Patent
Kumar et al.

(10) Patent No.: US 10,142,943 B2
(45) Date of Patent: Nov. 27, 2018

(54) TECHNIQUES AND APPARATUSES FOR PEAK TO AVERAGE RATIO (PAR) BASED POWER MANAGEMENT

(71) Applicant: QUALCOMM Incorporated, San Diego, CA (US)

(72) Inventors: Akash Kumar, Hyderabad (IN); Ankit Maheshwari, Hyderabad (IN); Revathi Sundara Raghavan, San Diego, CA (US); Jifeng Geng, San Diego, CA (US); Niranjan Kumar Vadlamudi, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 124 days.

(21) Appl. No.: 15/263,007

(22) Filed: Sep. 12, 2016

(65) Prior Publication Data

US 2017/0359784 A1    Dec. 14, 2017

Related U.S. Application Data

(60) Provisional application No. 62/349,755, filed on Jun. 14, 2016.

(51) Int. Cl.

| | | |
|---|---|---|
| *H01Q 11/12* | (2006.01) | |
| *H04B 1/04* | (2006.01) | |
| *H04W 52/22* | (2009.01) | |
| *H04W 72/04* | (2009.01) | |
| *H03F 1/02* | (2006.01) | |
| *H04L 27/26* | (2006.01) | |

(52) U.S. Cl.
CPC ........ *H04W 52/225* (2013.01); *H03F 1/0222* (2013.01); *H04L 27/2614* (2013.01); *H04W 72/0446* (2013.01); *H04W 72/0473* (2013.01)

(58) Field of Classification Search
CPC . H03F 1/0222; H04W 52/367; H04W 52/225; H04W 72/0446; H04W 72/0473; H04L 27/2614; H04L 1/1867
See application file for complete search history.

(56) References Cited

U.S. PATENT DOCUMENTS

| | | | |
|---|---|---|---|
| 6,535,066 B1 | 3/2003 | Petsko | |
| 8,774,258 B2 | 7/2014 | Tadano | |
| 9,270,230 B2 | 2/2016 | Henshaw et al. | |
| 9,391,649 B2 | 7/2016 | Wang | |
| 2008/0305824 A1* | 12/2008 | Haim | H04W 52/146 455/522 |
| 2011/0130105 A1* | 6/2011 | Chan | H03G 3/3042 455/127.2 |
| 2012/0219048 A1* | 8/2012 | Camuffo | H03F 1/0255 375/224 |
| 2014/0341318 A1 | 11/2014 | Pourkhaatoun et al. | |
| 2016/0099687 A1 | 4/2016 | Khlat | |

OTHER PUBLICATIONS

International Search Report and Written Opinion—PCT/US2017/035441—ISA/EPO—dated Oct. 4, 2017.

* cited by examiner

*Primary Examiner* — Nhan Le
(74) *Attorney, Agent, or Firm* — Harrity & Harrity, LLP

(57) ABSTRACT

Certain aspects of the present disclosure generally relate to wireless communications. In some aspects, a device may determine a peak to average ratio (PAR) value for a portion of a wireless transmission. In some aspects, the device may cause, based on the PAR value, a voltage to be applied to a power amplifier of the device to cause the device to transmit the portion of the wireless transmission.

30 Claims, 13 Drawing Sheets

TECHNIQUES AND APPARATUSES FOR PEAK TO AVERAGE RATIO (PAR) BASED POWER MANAGEMENT

CROSS-REFERENCE TO RELATED APPLICATION UNDER 35 U.S.C. § 119

This application claims priority to U.S. Provisional Patent Application No. 62/349,755 filed on Jun. 14, 2016 entitled "TECHNIQUES AND APPARATUSES FOR PEAK TO AVERAGE RATIO (PAR) BASED POWER MANAGEMENT," which is incorporated by reference herein.

FIELD OF THE DISCLOSURE

Aspects of the present disclosure generally relate to wireless communications, and more particularly to techniques and apparatuses for peak to average ratio (PAR) based power management, for example, techniques and apparatuses for causing, based on a PAR value, a voltage to be applied to a power amplifier or a transmitter of a device to cause the device to transmit a portion of a wireless transmission.

BACKGROUND

Wireless communication systems are widely deployed to provide various telecommunication services, such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency divisional multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, a national, a regional, and even a global level. An example of a telecommunication standard is Long Term Evolution (LTE). LTE is a set of enhancements to the Universal Mobile Telecommunications System (UMTS) mobile standard promulgated by Third Generation Partnership Project (3GPP). LTE is designed to better support mobile broadband Internet access by improving spectral efficiency, lowering costs, improving services, using new spectrum, and integrating with other open standards using OFDMA on the downlink (DL), SC-FDMA on the uplink (UL), and multiple-input multiple-output (MIMO) antenna technology.

SUMMARY

In some aspects, a method of wireless communication may include determining, by a device, a peak to average ratio (PAR) value for a portion of a wireless transmission associated with a first time slot. The method may include determining, by the device, a power variation metric for a second time slot, where the first time slot precedes the second time slot. The method may include selecting, by the device, a bias value for the second time slot based on the PAR value associated with the first time slot and the power variation metric for the second time slot. The method may include causing, by the device, a voltage to be applied to a power amplifier of the device based on the bias value as part of transmitting the portion of the wireless transmission.

In some aspects, a device may include one or more processors configured to determine a PAR value for a portion of a wireless transmission associated with a first time slot. The one or more processors may be configured to determine a power variation metric for a second time slot, where the first time slot precedes the second time slot. The one or more processors may be configured to select a bias value for the second time slot based on the PAR value associated with the first time slot and the power variation metric for the second time slot. The one or more processors may be configured to cause a voltage to be applied to a power amplifier of the device based on the bias value as part of transmitting the portion of the wireless transmission.

In some aspects, a non-transitory computer-readable medium may store one or more instructions for wireless communication. The one or more instructions may include one or more instructions that, when executed by one or more processors of a device, cause the one or more processors to determine a PAR value associated with a particular time slot for a portion of a wireless transmission. The one or more instructions may cause the one or more processors to select a bias value for the particular time slot based on the PAR value associated with the particular time slot. The one or more instructions may cause the one or more processors to cause a voltage to be applied to a power amplifier of the device based on the bias value as part of transmitting the portion of the wireless transmission.

In some aspects, an apparatus for wireless communication may include means for determining a PAR value associated with a particular time slot for a portion of a wireless transmission. The apparatus may include means for means for selecting a bias value for the particular time slot based on the PAR value associated with the particular time slot. The apparatus may include means for causing a voltage to be applied to a power amplifier of the apparatus based on the bias value as part of transmitting the portion of the wireless transmission.

Aspects generally include a method, wireless communication device, computer program product, non-transitory computer-readable medium (e.g., for storing instructions), user equipment (UE), and wireless access point, as substantially described herein with reference to and as illustrated by the accompanying drawings.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

The detailed description set forth below, in connection with the appended drawings, is intended as a description of various configurations and is not intended to represent the only configurations in which the concepts described herein may be practiced. The detailed description includes specific details for providing a thorough understanding of the various concepts. However, it will be apparent to those skilled in the art that these concepts may be practiced without these specific details.

The techniques described herein may be used for one or more of various wireless communication networks such as code division multiple access (CDMA) networks, time division multiple access (TDMA) networks, frequency division multiple access (FDMA) networks, orthogonal FDMA (OFDMA) networks, single carrier FDMA (SC-FDMA) networks, or other types of networks. A CDMA network may implement a radio access technology (RAT) such as universal terrestrial radio access (UTRA), CDMA2000, and/or the like. UTRA may include wideband CDMA (WCDMA) and/or other variants of CDMA. CDMA2000 may include Interim Standard (IS)-2000, IS-95 and IS-856 standards. IS-2000 may also be referred to as 1× radio transmission technology (1×RTT), CDMA2000 1×, and/or the like. A TDMA network may implement a RAT such as global system for mobile communications (GSM), enhanced data rates for GSM evolution (EDGE), or GSM/EDGE radio access network (GERAN). An OFDMA network may implement a RAT such as evolved UTRA (E-UTRA), ultra mobile broadband (UMB), Institute of Electrical and Electronics Engineers (IEEE) 802.11 (Wi-Fi), IEEE 802.16 (WiMAX), IEEE 802.20, Flash-OFDM, and/or the like. UTRA and E-UTRA may be part of the universal mobile telecommunication system (UMTS). 3GPP long-term evolution (LTE) and LTE-Advanced (LTE-A) are example releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the wireless networks and RATs mentioned above as well as other wireless networks and RATs.

Figure 1:
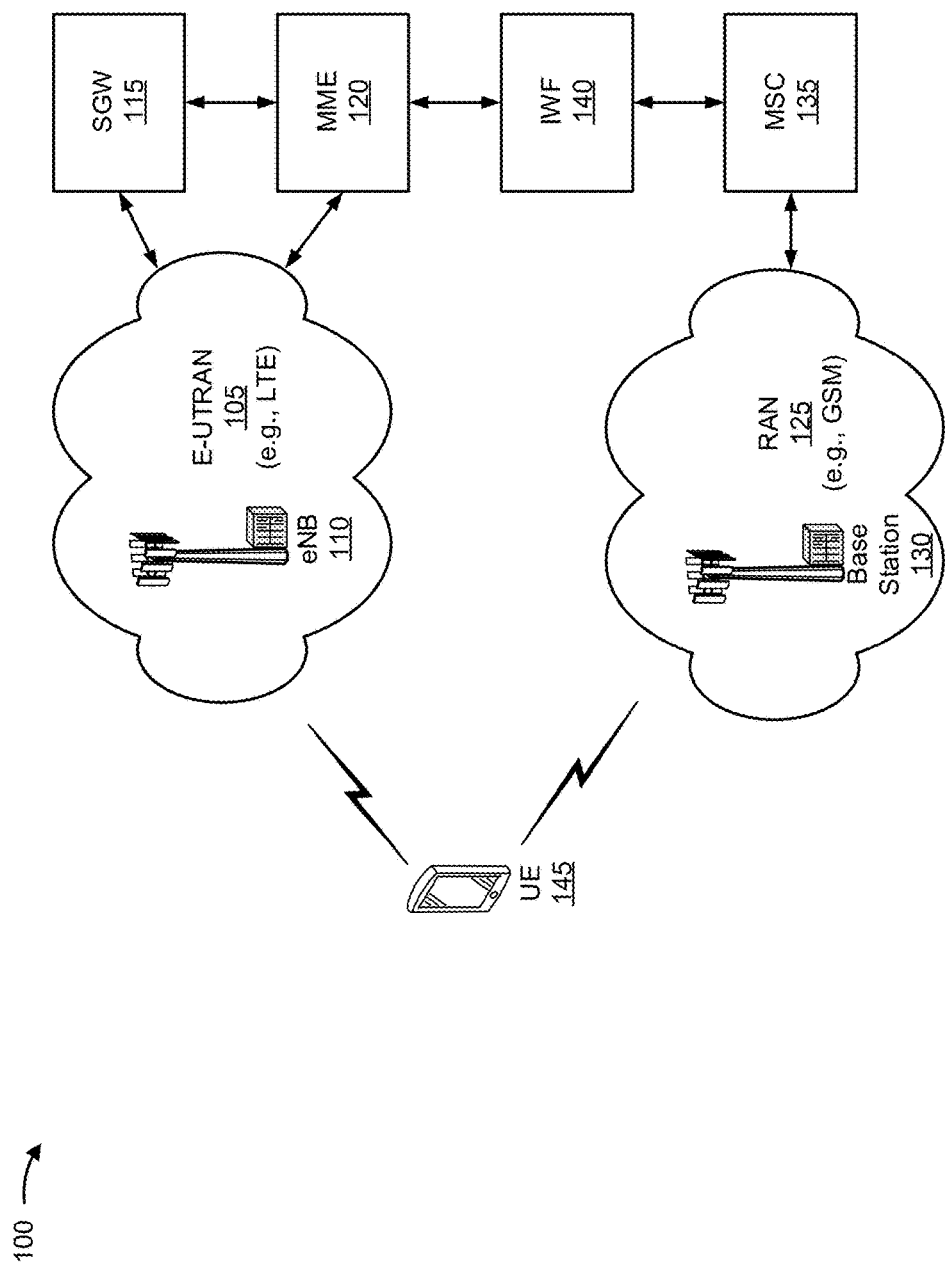
FIG. 1 is a diagram illustrating an example deployment in which multiple wireless networks have overlapping coverage, in accordance with various aspects of the present disclosure.

FIG. 1 is a diagram illustrating an example deployment 100 in which multiple wireless networks have overlapping coverage, in accordance with various aspects of the present disclosure. As shown, example deployment 100 may include a first radio access network (RAN), such as an evolved universal terrestrial radio access network (E-UTRAN) 105, which may include one or more evolved Node Bs (eNBs) 110, and which may communicate with other devices or networks via a serving gateway (SGW) 115 and/or a mobility management entity (MME) 120. As further shown, example deployment 100 may include a second RAN 125, which may include one or more base stations 130, and which may communicate with other devices or networks via a mobile switching center (MSC) 135 and/or an inter-working function (IWF) 140. As further shown, example deployment 100 may include one or more user equipment (UEs) 145 capable of communicating via E-UTRAN 105 and/or RAN 125.

E-UTRAN 105 may support, for example, LTE or another type of RAT. E-UTRAN 105 may include eNBs 110 and other network entities that can support wireless communication for UEs 145. Each eNB 110 may provide communication coverage for a particular geographic area. The term "cell" may refer to a coverage area of eNB 110 and/or an eNB subsystem serving the coverage area.

SGW 115 may communicate with E-UTRAN 105 and may perform various functions, such as packet routing and forwarding, mobility anchoring, packet buffering, initiation of network-triggered services, and/or the like. MME 120 may communicate with E-UTRAN 105 and SGW 115 and may perform various functions, such as mobility management, bearer management, distribution of paging messages, security control, authentication, gateway selection, and/or the like, for UEs 145 located within a geographic region served by MME 120 of E-UTRAN 105. The network entities in LTE are described in 3GPP TS 36.300, entitled "Evolved Universal Terrestrial Radio Access (E-UTRA) and Evolved Universal Terrestrial Radio Access Network (E-UTRAN); Overall description," which is publicly available.

RAN 125 may support, for example, GSM or another type of RAT. RAN 125 may include base stations 130 and other network entities that can support wireless communication for UEs 145. MSC 135 may communicate with RAN 125 and may perform various functions, such as voice services, routing for circuit-switched calls, and mobility management for UEs 145 located within a geographic region served by MSC 135 of RAN 125. In some aspects, IWF 140 may facilitate communication between MME 120 and MSC 135 (e.g., when E-UTRAN 105 and RAN 125 use different RATs). Additionally, or alternatively, MME 120 may communicate directly with an MME that interfaces with RAN 125, for example, without IWF 140 (e.g., when E-UTRAN 105 and RAN 125 use a common RAT). In some aspects, E-UTRAN 105 and RAN 125 may use a common frequency and/or a common RAT to communicate with UE 145. In some aspects, E-UTRAN 105 and RAN 125 may use different frequencies and/or different RATs to communicate with UEs 145.

In general, any number of wireless networks may be deployed in a given geographic area. Each wireless network may support a particular RAT and may operate on one or more frequencies. A RAT may also be referred to as a radio technology, an air interface, and/or the like. A frequency or frequency ranges may also be referred to as a carrier, a frequency channel, and/or the like. Each frequency or frequency range may support a single RAT in a given geographic area in order to avoid interference between wireless networks of different RATs.

UE 145 may be stationary or mobile and may also be referred to as a mobile station, a terminal, an access terminal, a wireless communication device, a subscriber unit, a station, a device, and/or the like. UE 145 may be a cellular phone, a personal digital assistant (PDA), a wireless modem, a wireless communication device, a handheld device, a laptop computer, a cordless phone, a wireless local loop (WLL) station, and/or the like.

Upon power up, UE 145 may search for wireless networks from which UE 145 can receive communication services. If UE 145 detects more than one wireless network, then a wireless network with the highest priority may be selected to serve UE 145 and may be referred to as the serving network. UE 145 may perform registration with the serving network, if necessary. UE 145 may then operate in a connected mode to actively communicate with the serving network. Alternatively, UE 145 may operate in an idle mode and camp on the serving network if active communication is not required by UE 145.

UE 145 may operate in the idle mode as follows. UE 145 may identify all frequencies/RATs on which it is able to find a "suitable" cell in a normal scenario or an "acceptable" cell in an emergency scenario, where "suitable" and "acceptable" are specified in the LTE standards. UE 145 may then camp on the frequency/RAT with the highest priority among all identified frequencies/RATs. UE 145 may remain camped on this frequency/RAT until either (i) the frequency/RAT is no longer available at a predetermined threshold or (ii) another frequency/RAT with a higher priority reaches this threshold. In some aspects, UE 145 may receive a neighbor list when operating in the idle mode, such as a neighbor list included in a system information block type 5 (SIB 5) provided by an eNB of a RAT on which UE 145 is camped. Additionally, or alternatively, UE 145 may generate a neighbor list. A neighbor list may include information identifying one or more frequencies, at which one or more RATs may be accessed, priority information associated with the one or more RATs, and/or the like.

A power management technique, such as power tracking (PT) and/or the like, may be performed to reduce a utilization of power by a transmitter to transmit network traffic and/or manage thermal conditions of the device. For example, a device, which may correspond to UE 145, eNB 110, or base station 130, may perform average power tracking (APT), envelope tracking (ET), and/or the like to reduce a utilization of power by a transmitter of the device relative to utilizing a static power level.

During average power tracking, the device may operate in a linear mode, for example, to control a voltage that is applied to a power amplifier of the device. For example, the device may periodically alter a bias value based on an average transmission power of a transmitter of the device. In this way, an amount of power that is dissipated, for example, as heat by the device is reduced relative to causing a static voltage to be applied to the power amplifier, thereby reducing a power consumption of the device. However, altering a bias value to control the voltage based on an average power of the transmitter may result in a power level for which the device still dissipates an excessive amount of power.

A device that is to perform envelope tracking, for example, may include an additional digital to analog convertor to track a bias value of a power amplifier of the device. During envelope tracking, the device may cause a voltage that is applied to the power amplifier to be based on continuously tracking a signal transmitted from the device and/or within a threshold voltage of a voltage required by the power amplifier to cause a signal associated with transmitting network traffic to be produced. This may reduce an amount of power that the device is to dissipate relative to, for example, performing average power tracking, thereby reducing a power consumption of the device. However, envelope tracking is complex and for power levels satisfying a threshold, such as a power level less than 20 decibels and/or the like, power consumption associated with operating the additional digital to analog converter may exceed power consumption reduced via envelope tracking, thereby obviating a benefit of envelope tracking. Moreover, including the additional digital to analog converter may increase a cost and/or a size of the device.

A device may perform PAR based power management, for example, by determining a PAR value associated with a modem or transmitter of the device for a particular time slot based on receiving information from a modem of the device. The PAR value may refer to a peak to average ratio determined based on an amplitude of a waveform (in contrast to a peak to average power ratio (PAPR) value, which may be determined based on a power of the waveform (e.g., an amplitude squared)). In another example, the PAR value may refer to a PAPR value.

In this case, the device may adjust a bias value based on the PAR value to cause a voltage provided to the power amplifier to be adjusted for the particular time slot. Additionally, or alternatively, the device may determine the PAR value for a first time slot, and may adjust a bias value based on the PAR value for the first time slot to cause a voltage provided to the power amplifier to be adjusted for a second time slot succeeding (e.g., immediately subsequent to) the first time slot. In this way, the device reduces a power consumed and/or that is to be dissipated by the device without requiring the additional digital to analog converter, thereby improving power consumption of the device, reducing a cost of the device, reducing a size of the device, and/or the like.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) shown in FIG. 1 may perform one or more functions described as being performed by another set of devices shown in FIG. 1.

Figure 2:
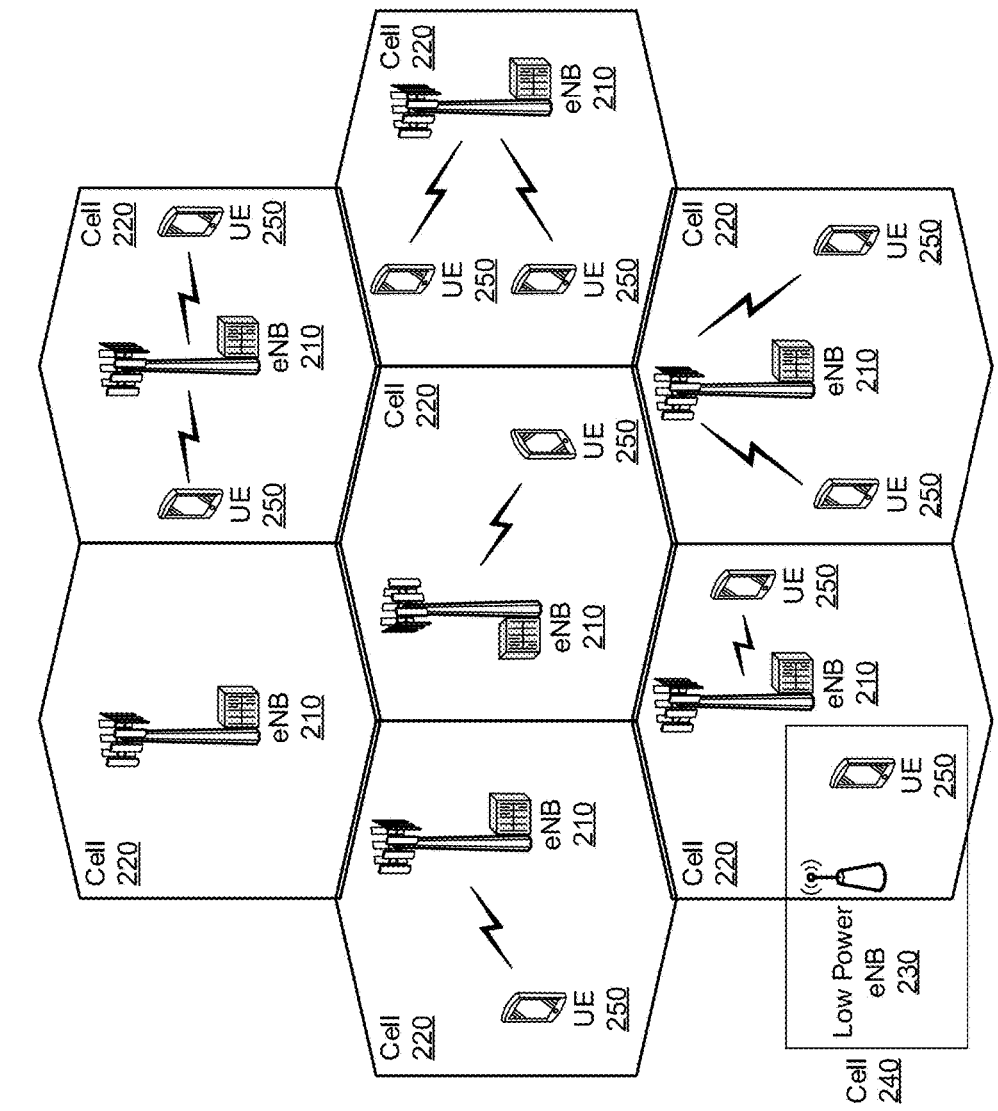
FIG. 2 is a diagram illustrating an example access network in an LTE network architecture, in accordance with various aspects of the present disclosure.

FIG. 2 is a diagram illustrating an example access network 200 in an LTE network architecture, in accordance with various aspects of the present disclosure. As shown, access network 200 may include one or more eNBs 210 that serve a corresponding set of cellular regions (cells) 220, one or more low power eNBs 230 that serve a corresponding set of cells 240, and a set of UEs 250.

Each eNB 210 may be assigned to a respective cell 220 and may be configured to provide an access point to a RAN. For example, eNB 110, 210 may provide an access point for UE 145, 250 to E-UTRAN 105 (e.g., eNB 210 may correspond to eNB 110, shown in FIG. 1) or may provide an access point for UE 145, 250 to RAN 125 (e.g., eNB 210 may correspond to base station 130, shown in FIG. 1). UE 145, 250 may correspond to UE 145, shown in FIG. 1. FIG. 2 does not illustrate a centralized controller for example access network 200, but access network 200 may use a centralized controller in some aspects. The eNBs 210 may perform radio related functions including radio bearer control, admission control, mobility control, scheduling, security, and network connectivity (e.g., to SGW 115).

As shown in FIG. 2, one or more low power eNBs 230 may serve respective cells 240, which may overlap with one or more cells 220 served by eNBs 210. The eNBs 230 may correspond to eNB 110 associated with E-UTRAN 105 and/or base station 130 associated with RAN 125, shown in FIG. 1. A low power eNB 230 may be referred to as a remote radio head (RRH). The low power eNB 230 may include a femto cell eNB (e.g., home eNB (HeNB)), a pico cell eNB, a micro cell eNB, and/or the like.

UE 145, 250 may determine to transmit information (e.g., one or more packets via one or more radio frames or sub-frames associated with one or more of time slots). UE 145, 250 may determine a PAR value for a portion of a wireless transmission to transmit the information. For example, in a first mode, UE 145, 250 may determine the PAR for a particular time slot, and may cause a voltage to be applied to a power amplifier of UE 145, 250 (e.g., to cause UE 145, 250) to transmit a portion of the information corresponding to the particular time slot. Additionally, or alternatively, in a second mode, UE 145, 250 may determine the PAR value for a first time slot based on feedback from a radio frequency transceiver of UE 145, 250, and may cause a voltage to be applied to the power amplifier to cause UE 145, 250 to transmit a portion of the information corresponding to a second time slot immediately subsequent to the first time slot.

Similarly, eNB 110, 210, 230 may determine to transmit information. eNB 110, 210, 230 may operate in the first mode to determine the PAR value for the particular time slot and adjust a voltage that is applied to a power amplifier of eNB 110, 210, 230 to cause eNB 110, 210, 230 to transmit a portion of the information corresponding to the particular time slot. Additionally, or alternatively, eNB 110, 210, 230 may operate in the second mode to determine the PAR value for a first time slot and adjust a voltage that is applied to a power amplifier to cause eNB 110, 210, 230 to transmit a portion of the information corresponding to a second time slot succeeding (e.g., immediately subsequent) to the first time slot. In this way, a power consumption associated with UE 145, 250 and/or eNB 110, 210, 230 is reduced relative to using a static voltage level. Moreover, based on providing a voltage based on a PAR value, UE 145, 250 and/or eNB 110, 210, 230 obviate a need for an additional digital to analog converter associated with performing envelope tracking, thereby reducing a size and/or a cost of UE 145, 250 and/or eNB 110, 210, 230, while providing power management close to that provided by envelope tracking.

A modulation and multiple access scheme employed by access network 200 may vary depending on the particular telecommunications standard being deployed. In LTE applications, OFDM is used on the downlink (DL) and SC-FDMA is used on the uplink (UL) to support both frequency division duplexing (FDD) and time division duplexing (TDD). The various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. As another example, these concepts may also be extended to UTRA employing WCDMA and other variants of CDMA (e.g., such as TD-SCDMA, GSM employing TDMA, E-UTRA, and/or the like), UMB, IEEE 802.11 (Wi-Fi), IEEE 802.16 (WiMAX), IEEE 802.20, Flash-OFDM employing OFDMA, and/or the like. UTRA, E-UTRA, UMTS, LTE, and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The eNBs 110, 210, 230 may have multiple antennas supporting MIMO technology. The use of MIMO technology enables eNBs 110, 210, 230 to exploit the spatial domain to support spatial multiplexing, beamforming, and transmit diversity. Spatial multiplexing may be used to transmit different streams of data simultaneously on the same frequency. The data streams may be transmitted to a single UE 145, 250 to increase the data rate or to multiple UEs 250 to increase the overall system capacity. This may be achieved by spatially precoding each data stream (e.g., applying a scaling of an amplitude and a phase) and then transmitting each spatially precoded stream through multiple transmit antennas on the DL. The spatially precoded data streams arrive at the UE(s) 250 with different spatial signatures, which enables each of the UE(s) 250 to recover the one or more data streams destined for that UE 145, 250. On the UL, each UE 145, 250 transmits a spatially precoded data stream, which enables eNBs 110, 210, 230 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR), which is sometimes referred to as a PAR value.

The number and arrangement of devices and cells shown in FIG. 2 are provided as an example. In practice, there may be additional devices and/or cells, fewer devices and/or cells, different devices and/or cells, or differently arranged devices and/or cells than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) shown in FIG. 2 may perform one or more functions described as being performed by another set of devices shown in FIG. 2.

Figure 3:
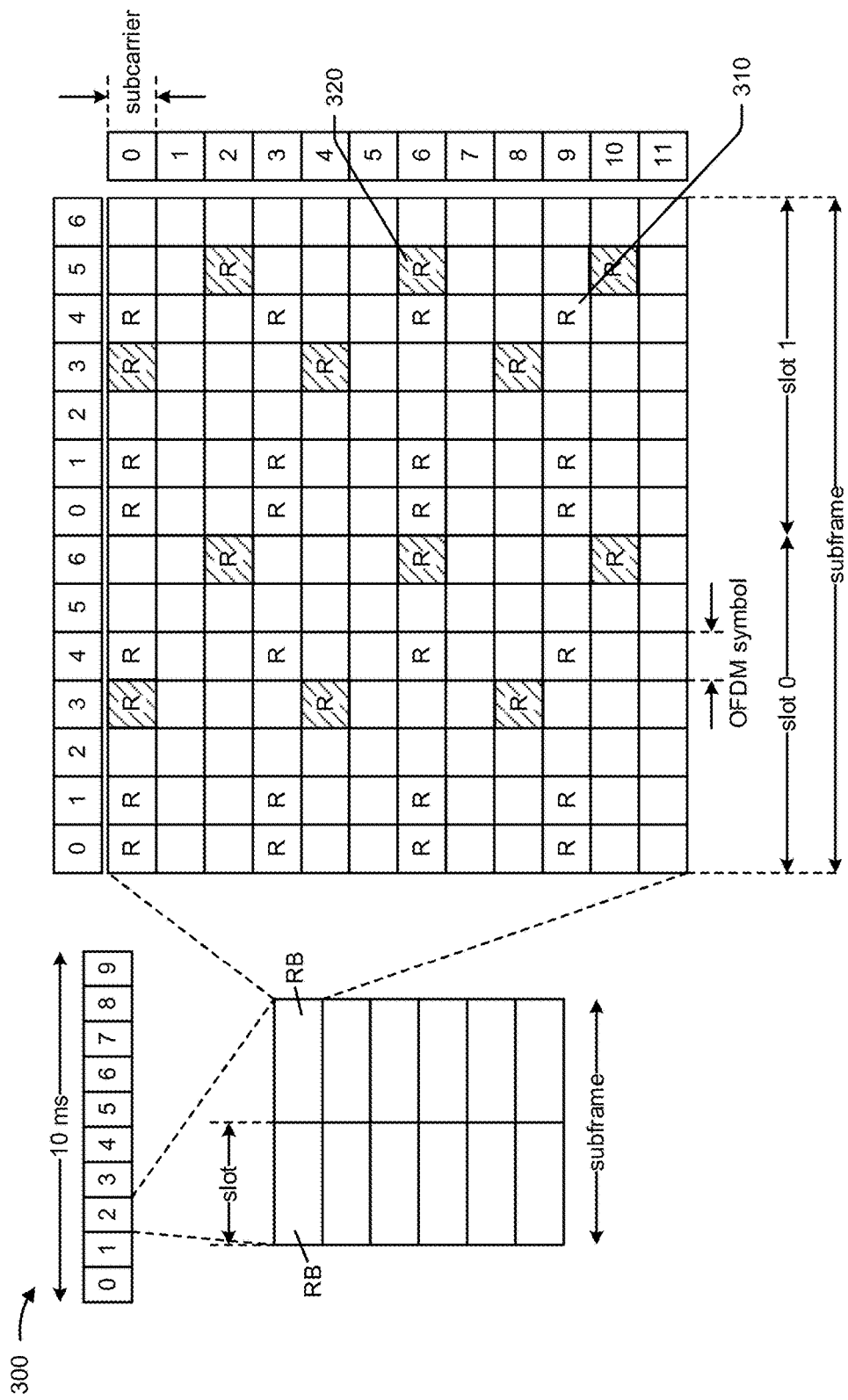
FIG. 3 is a diagram illustrating an example of a downlink frame structure in LTE, in accordance with various aspects of the present disclosure.

FIG. 3 is a diagram illustrating an example 300 of a downlink (DL) frame structure in LTE, in accordance with various aspects of the present disclosure. A frame (e.g., of 10 ms) may be divided into 10 equally sized sub-frames with indices of 0 through 9. Each sub-frame may include two consecutive time slots. A resource grid may be used to represent two time slots, each time slot including a resource block (RB). The resource grid is divided into multiple resource elements. In LTE, a resource block includes 12 consecutive subcarriers in the frequency domain and, for a normal cyclic prefix in each OFDM symbol, 7 consecutive OFDM symbols in the time domain, or 84 resource elements. For an extended cyclic prefix, a resource block includes 6 consecutive OFDM symbols in the time domain and has 72 resource elements. Some of the resource elements, as indicated as R 310 and R 320, include DL reference signals (DL-RS). The DL-RS include Cell-specific RS (CRS) (also sometimes called common RS) 310 and UE-specific RS (UE-RS) 320. UE-RS 320 are transmitted only on the resource blocks upon which the corresponding physical DL shared channel (PDSCH) is mapped. The number of bits carried by each resource element depends on the modulation scheme. Thus, the more resource blocks that a UE receives and the higher the modulation scheme, the higher the data rate for the UE.

In LTE, an eNB may send a primary synchronization signal (PSS) and a secondary synchronization signal (SSS) for each cell in the eNB. The primary and secondary synchronization signals may be sent in symbol periods 6 and 5, respectively, in each of subframes 0 and 5 of each radio frame with the normal cyclic prefix (CP). The synchronization signals may be used by UEs for cell detection and acquisition. The eNB may send a Physical Broadcast Channel (PBCH) in symbol periods 0 to 3 in slot 1 of subframe 0. The PBCH may carry certain system information.

The eNB may send a Physical Control Format Indicator Channel (PCFICH) in the first symbol period of each subframe. The PCFICH may convey the number of symbol periods (M) used for control channels, where M may be equal to 1, 2, or 3 and may change from subframe to subframe. M may also be equal to 4 for a small system bandwidth, e.g., with less than 10 resource blocks. The eNB may send a Physical HARQ Indicator Channel (PHICH) and a Physical Downlink Control Channel (PDCCH) in the first M symbol periods of each subframe. The PHICH may carry information to support hybrid automatic repeat request (HARQ). The PDCCH may carry information on resource allocation for UEs and control information for downlink channels. The eNB may send a Physical Downlink Shared Channel (PDSCH) in the remaining symbol periods of each subframe. The PDSCH may carry data for UEs scheduled for data transmission on the downlink.

The eNB may send the PSS, SSS, and PBCH in the center 1.08 MHz of the system bandwidth used by the eNB. The eNB may send the PCFICH and PHICH across the entire system bandwidth in each symbol period in which these channels are sent. The eNB may send the PDCCH to groups of UEs in certain portions of the system bandwidth. The eNB may send the PDSCH to specific UEs in specific portions of the system bandwidth. The eNB may send the PSS, SSS, PBCH, PCFICH, and PHICH in a broadcast manner to all UEs, may send the PDCCH in a unicast manner to specific UEs, and may also send the PDSCH in a unicast manner to specific UEs.

A number of resource elements may be available in each symbol period. Each resource element (RE) may cover one subcarrier in one symbol period and may be used to send one modulation symbol, which may be a real or complex value. Resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1, and 2. The PDCCH may occupy 9, 18, 36, or 72 REGs, which may be selected from the available REGs, in the first M symbol periods, for example. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for the PDCCH. An eNB may send the PDCCH to the UE in any of the combinations that the UE will search.

eNB 110, 210, 230 may transmit information to UE 145, 250 via a DL frame, as described herein. eNB 110, 210, 230 may determine a PAR value of a time slot associated with the DL frame, and may cause a voltage to be applied to a power amplifier of eNB 110, 210, 230 based on a bias value associated with the PAR value. This may cause eNB 110, 210, 230 to transmit a wireless transmission corresponding to the time slot associated with the DL frame to UE 145, 250 and/or another eNB 110, 210, 230. In this way, eNB 110, 210, 230 may reduce a power consumption of eNB 110, 210, 230 relative to transmitting the DL frame using a static voltage level for the power amplifier and approach the performance of envelope tracking without the complexity of envelope tracking.

As indicated above, FIG. 3 is provided as an example. Other examples are possible and may differ from what was described above in connection with FIG. 3.

Figure 4:
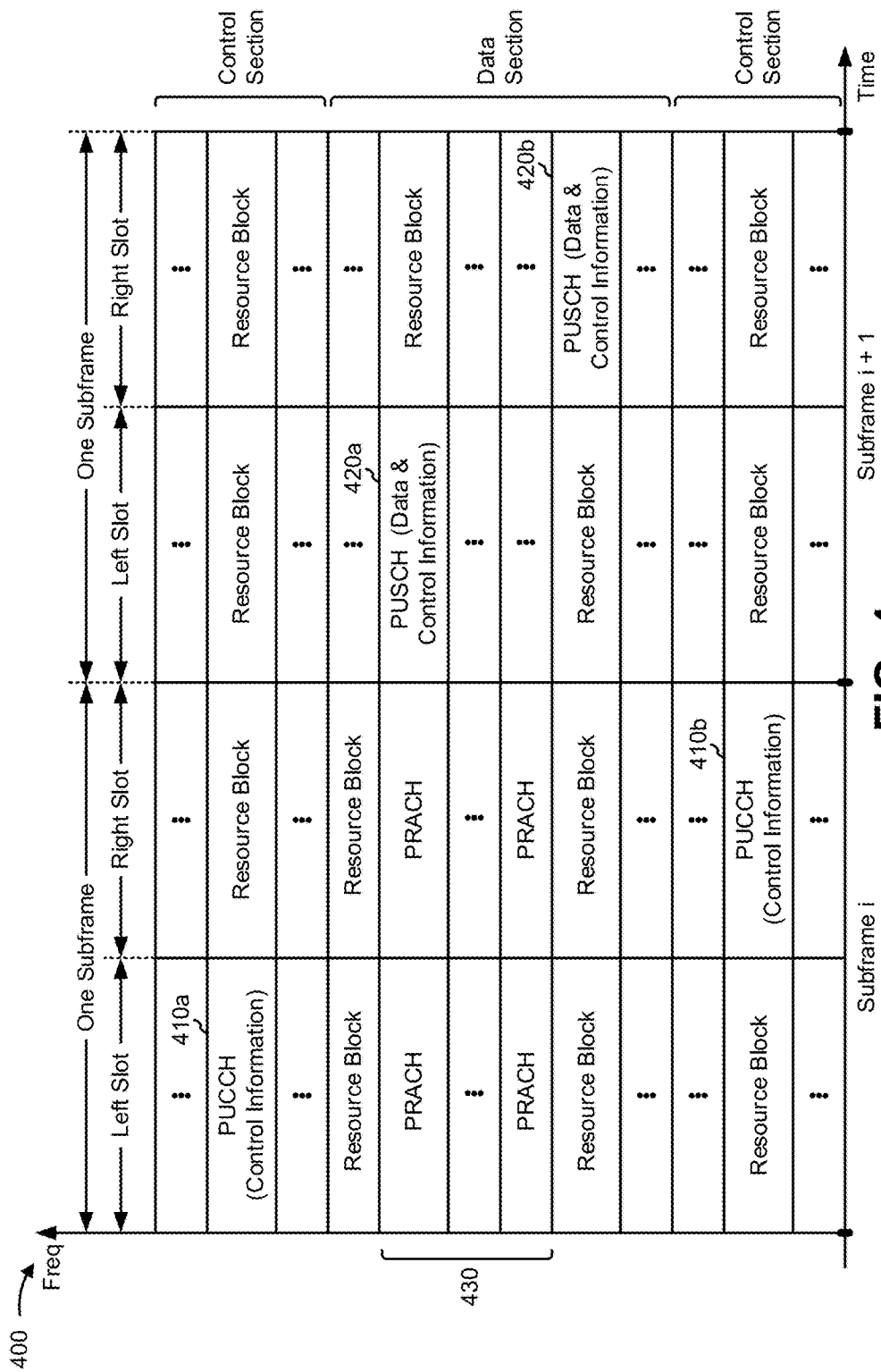
FIG. 4 is a diagram illustrating an example of an uplink frame structure in LTE, in accordance with various aspects of the present disclosure.

FIG. 4 is a diagram illustrating an example 400 of an uplink (UL) frame structure in LTE, in accordance with various aspects of the present disclosure. The available resource blocks for the UL may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The UL frame structure results in the data section including contiguous subcarriers, which may allow a single UE to be assigned all of the contiguous subcarriers in the data section.

A UE may be assigned resource blocks 410a, 410b in the control section to transmit control information to an eNB. The UE may also be assigned resource blocks 420a, 420b in the data section to transmit data to the eNB. The UE may transmit control information in a physical UL control channel (PUCCH) on the assigned resource blocks in the control section. The UE may transmit only data or both data and control information in a physical UL shared channel (PUSCH) on the assigned resource blocks in the data section. A UL transmission may span both slots of a subframe and may hop across frequencies.

A set of resource blocks may be used to perform initial system access and achieve UL synchronization in a physical random access channel (PRACH) 430. The PRACH 430 carries a random sequence and cannot carry any UL data/signaling. Each random access preamble occupies a bandwidth corresponding to six consecutive resource blocks. The starting frequency is specified by the network. That is, the transmission of the random access preamble is restricted to certain time and frequency resources. There is no frequency hopping for the PRACH. The PRACH attempt is carried in a single subframe (e.g., of 1 ms) or in a sequence of few contiguous subframes and a UE can make only a single PRACH attempt per frame (e.g., of 10 ms).

UE 145, 250 may transmit one or more signals via a UL frame, as described herein. For example, UE 145, 250 may determine a PAR value for a time slot associated with the UL frame, and may cause a voltage to be applied to a power amplifier of UE 145, 250 based on a bias value associated with the PAR value. This may cause UE 145, 250 to transmit a portion of a wireless transmission corresponding to the time slot associated with the UL frame to eNB 110, 210, 230 and/or another UE 145, 250. In this way, UE 145, 250 may reduce a power consumption of UE 145, 250 relative to utilizing a static voltage level for the power amplifier and approach the performance of envelope tracking without the complexity of envelope tracking.

As indicated above, FIG. 4 is provided as an example. Other examples are possible and may differ from what was described above in connection with FIG. 4.

Figure 5:
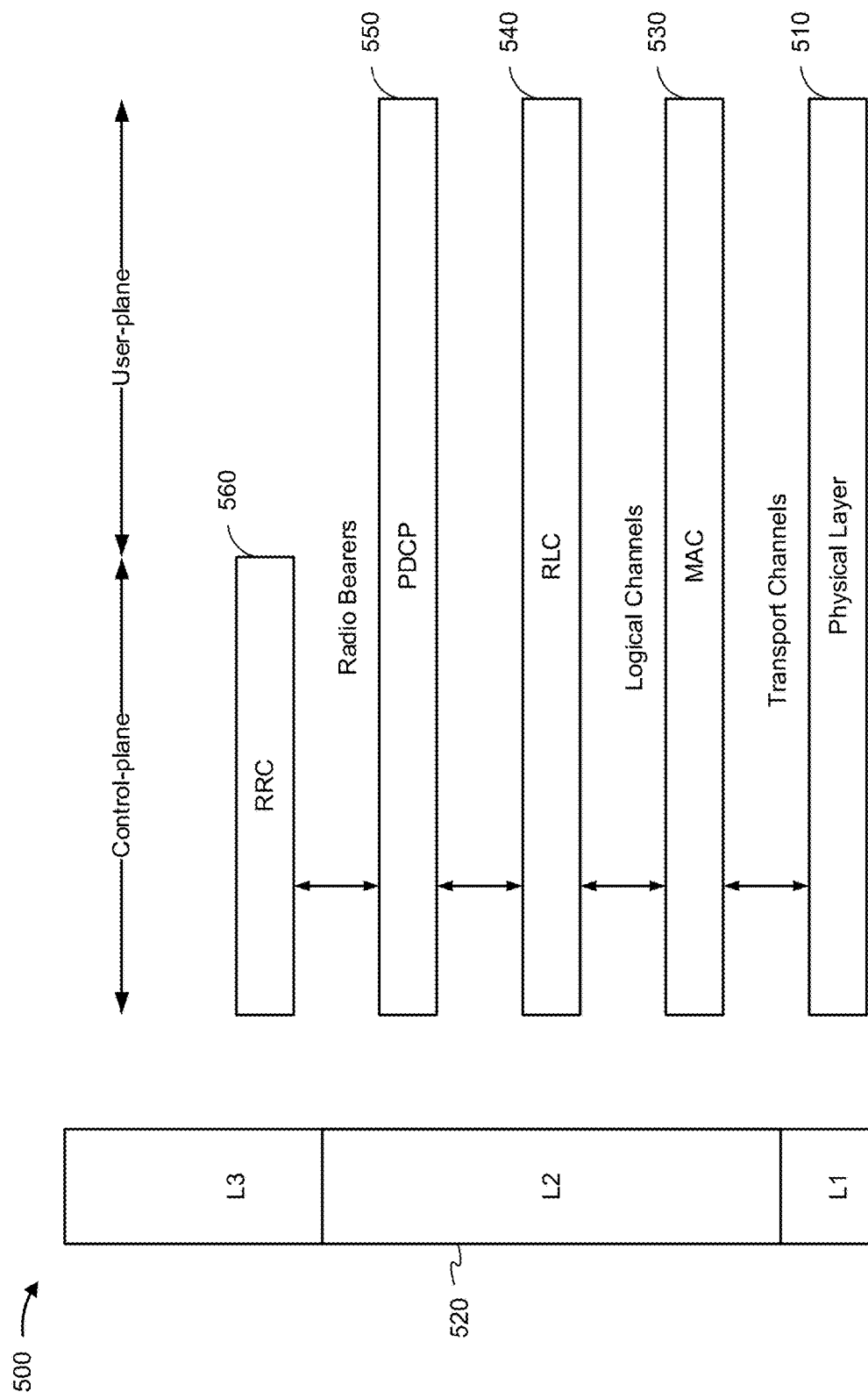
FIG. 5 is a diagram illustrating an example of a radio protocol architecture for a user plane and a control plane in LTE, in accordance with various aspects of the present disclosure.

FIG. 5 is a diagram illustrating an example 500 of a radio protocol architecture for a user plane and a control plane in LTE, in accordance with various aspects of the present disclosure. The radio protocol architecture for the UE and the eNB is shown with three layers: Layer 1, Layer 2, and Layer 3. Layer 1 (L1 layer) is the lowest layer and implements various physical layer signal processing functions. The L1 layer will be referred to herein as the physical layer 510. Layer 2 (L2 layer) 520 is above the physical layer 510 and is responsible for the link between the UE and eNB over the physical layer 510.

In the user plane, the L2 layer 520, for example, includes a media access control (MAC) sublayer 530, a radio link control (RLC) sublayer 540, and/or a packet data convergence protocol (PDCP) 550 sublayer, which are terminated at the eNB on the network side. Although not shown, the UE may have several upper layers above the L2 layer 520 including a network layer (e.g., IP layer) that is terminated at a packet data network (PDN) gateway on the network side, and an application layer that is terminated at the other end of the connection (e.g., far end UE, server, and/or the like).

The PDCP sublayer 550 provides multiplexing between different radio bearers and logical channels. The PDCP sublayer 550 also provides header compression for upper layer data packets to reduce radio transmission overhead, security by ciphering the data packets, and handover support for UEs between eNBs. The RLC sublayer 540 provides segmentation and reassembly of upper layer data packets, retransmission of lost data packets, and reordering of data packets to compensate for out-of-order reception due to hybrid automatic repeat request (HARQ). The MAC sublayer 530 provides multiplexing between logical and transport channels. The MAC sublayer 530 is also responsible for allocating the various radio resources (e.g., resource blocks) in one cell among the UEs. The MAC sublayer 530 is also responsible for HARQ operations.

In the control plane, the radio protocol architecture for the UE and eNB is substantially the same for the physical layer 510 and the L2 layer 520 with the exception that there is no header compression function for the control plane. The control plane also includes a radio resource control (RRC) sublayer 560 in Layer 3 (L3 layer). The RRC sublayer 560 is responsible for obtaining radio resources (e.g., radio bearers) and for configuring the lower layers using RRC signaling between the eNB and the UE.

As indicated above, FIG. 5 is provided as an example. Other examples are possible and may differ from what was described above in connection with FIG. 5.

Figure 6:
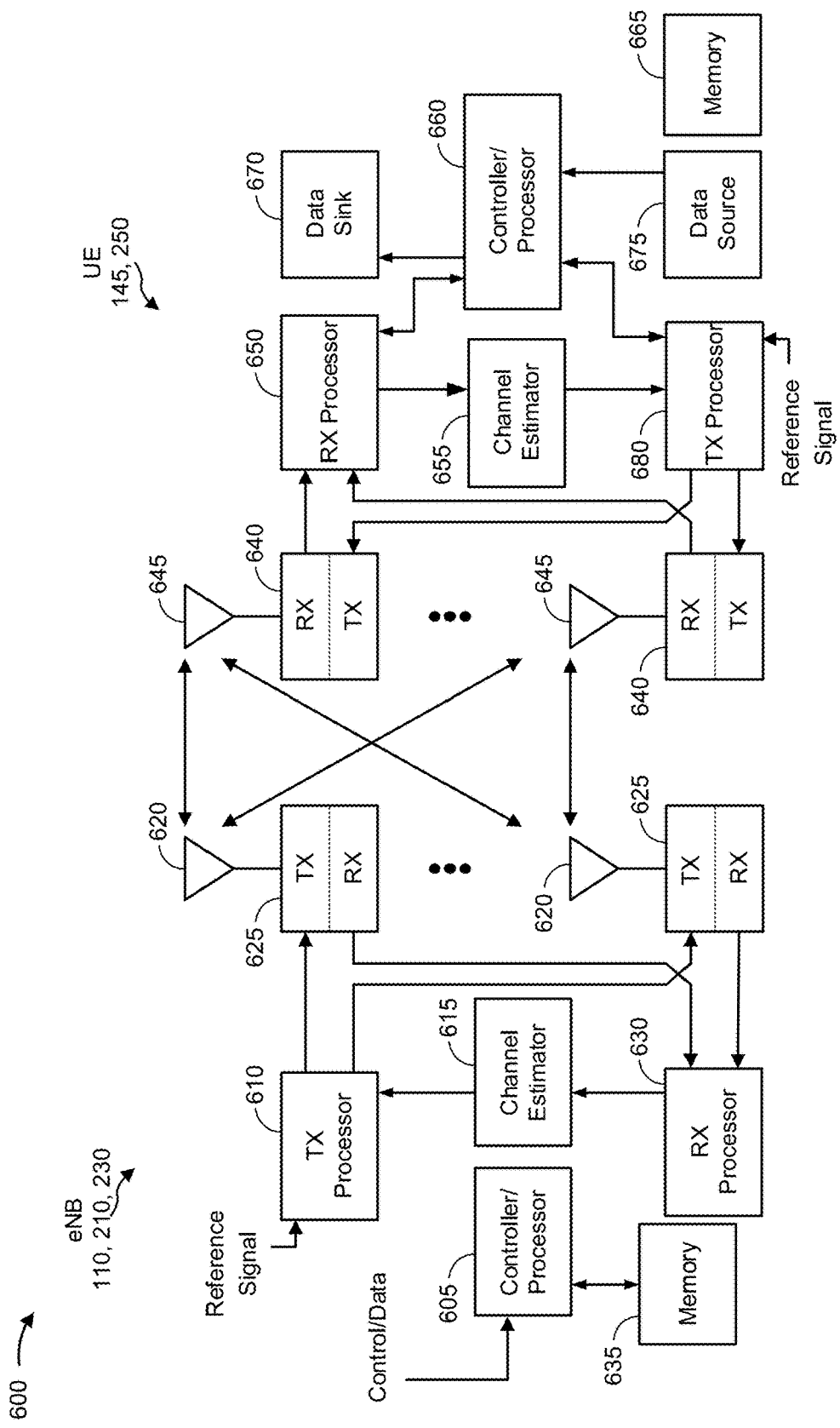
FIG. 6 is a diagram illustrating example components of an evolved Node B and a user equipment in an access network, in accordance with various aspects of the present disclosure.

FIG. 6 is a diagram illustrating example components 600 of eNB 110, 210, 230 and UE 145, 250 in an access network, in accordance with various aspects of the present disclosure. As shown in FIG. 6, eNB 110, 210, 230 may include a controller/processor 605, a transmitter (TX) processor 610, a channel estimator 615, an antenna 620, a transmitter 625TX, a receiver 625RX, a receiver (RX) processor 630, and a memory 635. As further shown in FIG. 6, UE 145, 250 may include a receiver RX 640RX, for example, of a transceiver TX/RX 640, a transmitter TX 640TX, for example, of a transceiver TX/RX 640, an antenna 645, an RX processor 650, a channel estimator 655, a controller/processor 660, a memory 665, a data sink 670, a data source 675, and a TX processor 680.

In the DL, upper layer packets from the core network are provided to controller/processor 605. The controller/processor 605 implements the functionality of the L2 layer. In the DL, the controller/processor 605 provides header compression, ciphering, packet segmentation and reordering, multiplexing between logical and transport channels, and radio resource allocations to the UE 145, 250 based, at least in part, on various priority metrics. The controller/processor 605 is also responsible for HARQ operations, retransmission of lost packets, and signaling to the UE 145, 250.

The TX processor 610 implements various signal processing functions for the L1 layer (e.g., physical layer). The signal processing functions includes coding and interleaving to facilitate forward error correction (FEC) at the UE 145, 250 and mapping to signal constellations based, at least in part, on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 615 may be used to determine the coding and modulation scheme, as well as for spatial processing. The channel estimate may be derived from a reference signal and/or channel condition feedback transmitted by the UE 145, 250. Each spatial stream is then provided to a different antenna 620 via a separate transmitter TX 640TX, for example, of transceiver TX/RX 625. Each such transmitter TX 640TX modulates an RF carrier with a respective spatial stream for transmission.

At the UE 145, 250, each receiver RX 640RX, for example, of a transceiver TX/RX 640 receives a signal through its respective antenna 645. Each such receiver RX 640RX recovers information modulated onto an RF carrier and provides the information to the receiver (RX) processor 650. The RX processor 650 implements various signal processing functions of the L1 layer. The RX processor 650 performs spatial processing on the information to recover any spatial streams destined for the UE 145, 250. If multiple spatial streams are destined for the UE 145, 250, the spatial streams may be combined by the RX processor 650 into a single OFDM symbol stream. The RX processor 650 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 110, 210, 230. These soft decisions may be based, at least in part, on channel estimates computed by the channel estimator 655. The soft decisions are then decoded and deinterleaved to recover the data and control signals that were originally transmitted by the eNB 110, 210, 230 on the physical channel. The data and control signals are then provided to the controller/processor 660.

The controller/processor 660 implements the L2 layer. The controller/processor 660 can be associated with a memory 665 that stores program codes and data. The memory 665 may include a non-transitory computer-readable medium. In some aspects, the memory 665 may store the data structure storing a set of bias values associated with (e.g., that map to) a set of PAR values. In the UL, the controller/processor 660 provides demultiplexing between transport and logical channels, packet reassembly, deciphering, header decompression, control signal processing to recover upper layer packets from the core network. The upper layer packets are then provided to a data sink 670, which represents all the protocol layers above the L2 layer. Various control signals may also be provided to the data sink 670 for L3 processing. The controller/processor 660 is also responsible for error detection using a positive acknowledgement (ACK) and/or negative acknowledgement (NACK) protocol to support HARQ operations.

In the UL, a data source 675 is used to provide upper layer packets to the controller/processor 660. The data source 675 represents all protocol layers above the L2 layer. Similar to the functionality described in connection with the DL transmission by the eNB 110, 210, 230, the controller/processor 660 implements the L2 layer for the user plane and the control plane by providing header compression, ciphering, packet segmentation and reordering, and multiplexing between logical and transport channels based, at least in part, on radio resource allocations by the eNB 110, 210, 230.

The controller/processor 660 is also responsible for HARQ operations, retransmission of lost packets, and signaling to the eNB 110, 210, 230.

Channel estimates derived by a channel estimator 655 from a reference signal or feedback transmitted by the eNB 110, 210, 230 may be used by the TX processor 680 to select the appropriate coding and modulation schemes, and to facilitate spatial processing. The spatial streams generated by the TX processor 680 are provided to different antenna 645 via separate transmitters TX, for example, of transceivers TX/RX 640. Each transmitter TX 640TX, for example, of transceiver TX/RX 640 modulates an RF carrier with a respective spatial stream for transmission.

The UL transmission is processed at the eNB 110, 210, 230 in a manner similar to that described in connection with the receiver function at the UE 145, 250. Each receiver RX 640RX, for example, of transceiver TX/RX 625 receives a signal through its respective antenna 620. Each receiver RX 640RX, for example, of transceiver TX/RX 625 recovers information modulated onto an RF carrier and provides the information to a RX processor 630. The RX processor 630 may implement the L1 layer.

The controller/processor 605 implements the L2 layer. The controller/processor 605 can be associated with a memory 635 that stores program code and data. The memory 635 may be referred to as a computer-readable medium. In some aspects, the memory 635 may store the data structure storing a set of bias values associated with (e.g., that map to) a set of PAR values. In the UL, the controller/processor 605 provides demultiplexing between transport and logical channels, packet reassembly, deciphering, header decompression, control signal processing to recover upper layer packets from the UE 145, 250. Upper layer packets from the controller/processor 605 may be provided to the core network. The controller/processor 605 is also responsible for error detection using an ACK and/or NACK protocol to support HARQ operations.

One or more components of UE 145, 250 and/or eNB 110, 210, 230 may be configured to cause a voltage to be applied to a power amplifier based on a bias value associated with a PAR value of a portion of a wireless transmission, as described in more detail elsewhere herein. For example, the controller/processor 660 and/or other processors and modules of UE 145, 250 may perform or direct operations of, for example, process 900 of FIG. 9, process 1000 of FIG. 10, process 1100 of FIG. 11, and/or other processes, as described herein. Additionally or alternatively, the controller/processor 605 and/or other processors and modules of eNB 110, 210, 230 may perform or direct operations of, for example, process 900 of FIG. 9, process 1000 of FIG. 10, process 1100, of FIG. 11, and/or other processes, as described herein. In some aspects, one or more of the components shown in FIG. 6 may be employed to perform process 900 of FIG. 9, process 1000 of FIG. 10, process 1100 of FIG. 11, and/or other processes for the techniques described herein.

The number and arrangement of components shown in FIG. 6 are provided as an example. In practice, there may be additional components, fewer components, different components, or differently arranged components than those shown in FIG. 6. Furthermore, two or more components shown in FIG. 6 may be implemented within a single component, or a single component shown in FIG. 6 may be implemented as multiple, distributed components. Additionally, or alternatively, a set of components (e.g., one or more components) shown in FIG. 6 may perform one or more functions described as being performed by another set of components shown in FIG. 6.

As described in more detail below, a device, such as a wireless communication device, which may correspond to UE 145, 250, or a wireless access point, which may correspond to eNB 110, 210, 230, and/or the like, may transmit data via a transmitter. The device may determine a PAR value for a portion of a transmission of the data. The device may determine a bias value based on the PAR value, and may cause a voltage to be applied to a power amplifier of the device based on the bias value. Based on causing the voltage to be applied to the power amplifier, the device may cause data to be transmitted by the device without requiring an excessive amount of power to be dissipated by the power amplifier, thereby improving and/or reducing a power consumption relative to another power management technique. Moreover, based on obviating the need for one or more additional components, such as a digital to analog converter, to control the voltage provided to the power amplifier, the device may be constructed with a reduced cost and/or with a reduced size.

Figure 7A:
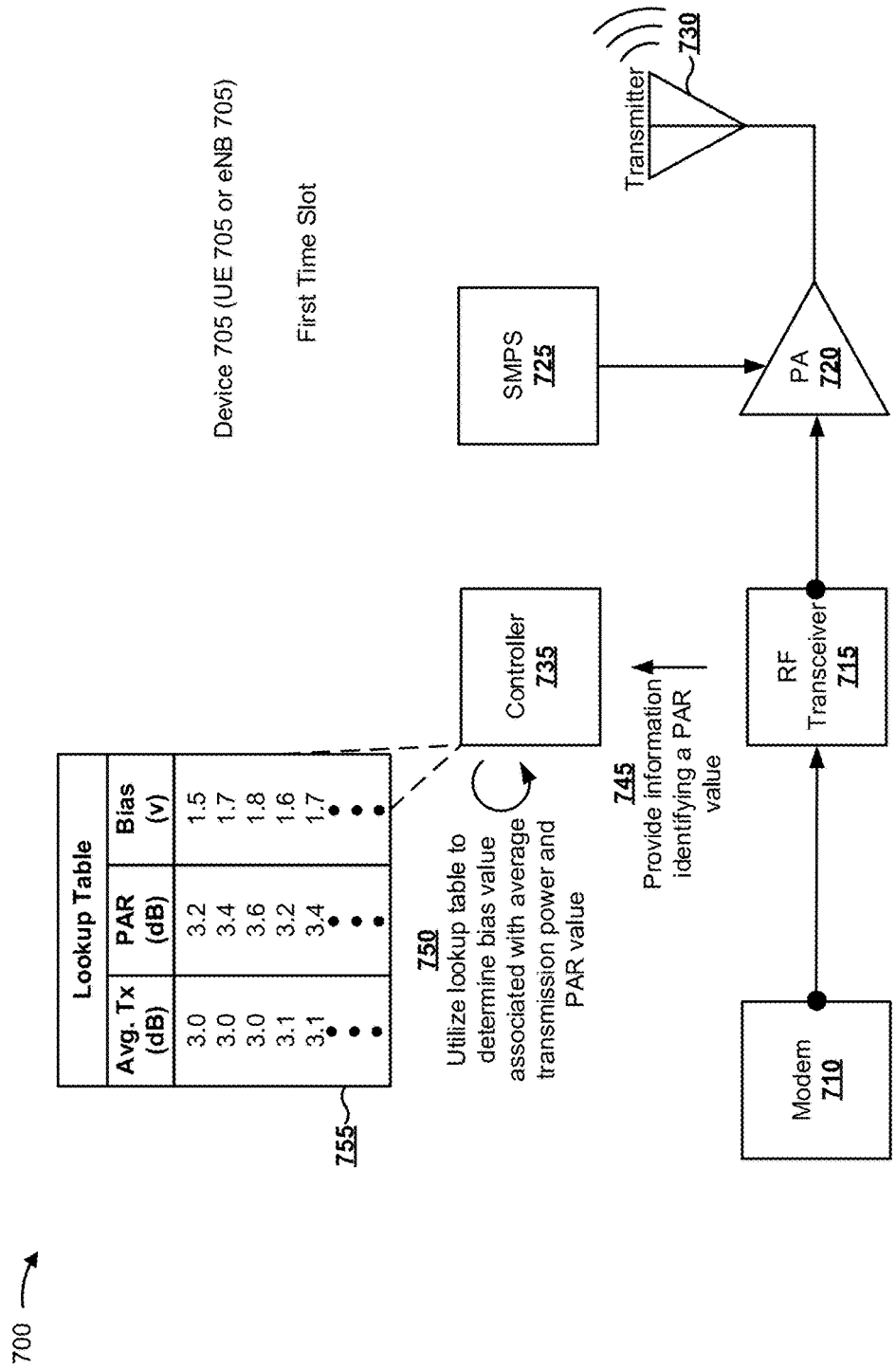
FIGS. 7A and 7B are diagrams of an overview of example aspects described herein, in accordance with various aspects of the present disclosure.
Figure 7B:
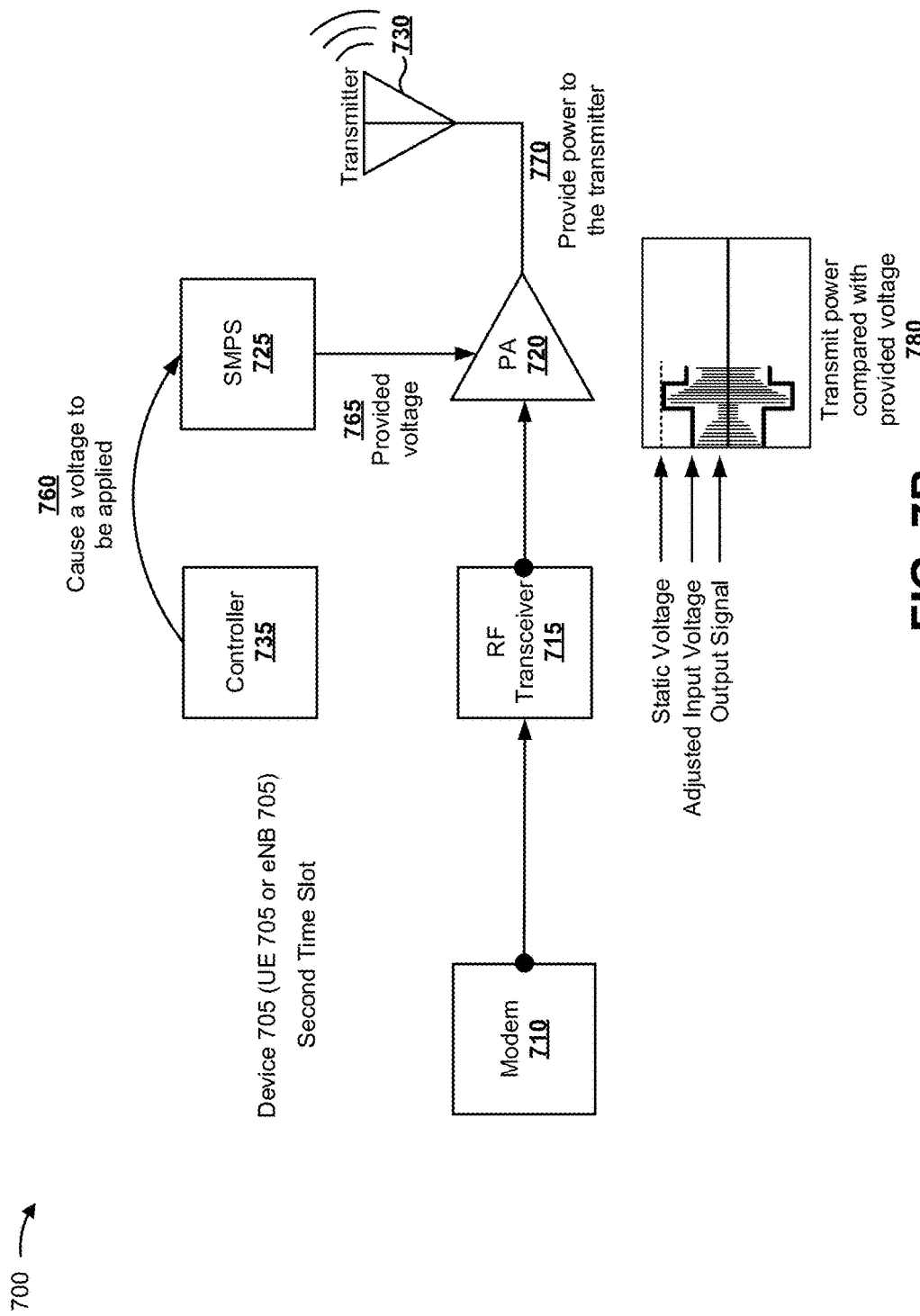

FIGS. 7A and 7B are diagrams illustrating an example 700 of performing PAR based power management, in accordance with various aspects of the present disclosure.

As shown in FIG. 7A, a device 705 (e.g., a UE, such as UE 145, 250, or an eNB, such as eNB 110, 210, 230) may include a modem 710, a radio frequency (RF) transceiver 715, a power amplifier (PA) 720, a power supply, such as a switch mode power supply (SMPS) 725, a transmitter 730, and a controller 735. Data is provided via modem 710 and RF transceiver 715 for power amplification by power amplifier 720. Power amplifier 720 receives an input voltage from the power supply, such as the SMPS 725. Power amplifier 720 performs power amplification of an input signal from RF transceiver 715 based on the input voltage, and provides an output signal to transmitter 730 for transmission.

As further shown in FIG. 7A, and by reference number 745, controller 735 may receive, from RF transceiver 715, information identifying a PAR value for a first time slot based on providing the input signal to power amplifier 720. In some aspects, controller 735 may receive, from RF transceiver 715 or from transmitter 730, information identifying an average transmit power associated with the first time slot (e.g., based on transmitter 730 transmitting the output signal received from power amplifier 720). In some aspects, controller 735 may receive information identifying a power variance metric associated with a maximum variance in power level between a signal associated with the first time slot and a signal associated with a second time slot. As shown by reference number 750, controller 735 may utilize a lookup table 755 to determine a bias value for the second time slot based on the PAR value, the average transmit power, the power variance metric, and/or the like. The bias value may correspond to a particular voltage that is to be provided as input to power amplifier 720 for the second time slot.

As shown in FIG. 7B, and by reference number 760, based on the bias value, controller 735 may cause a voltage to be applied to power amplifier 720 by SMPS 725. For example, controller 735 may transmit a control signal to SMPS 725 to cause SMPS 725 to provide a voltage, to power amplifier 720, selected based on the bias value. As shown by reference number 765, based on receiving the signal from controller 735, SMPS 725 causes the voltage to be provided to power amplifier 720 for the second time slot. This may cause power amplifier 720 to generate an output signal for the second time slot based on the provided voltage and an input signal for the second time slot received from RF transceiver 715. As shown by reference number 770, power amplifier 720 causes the output signal to be transmitted by transmitter 730. As shown by reference number 780, a difference between the provided voltage and a transmit power for the output signal corresponds to a power dissipation by power amplifier 720 to generate the output signal. In this case, utilizing an adjusted input voltage (e.g., applied to the power amplifier 720 as described above) results in a lesser amount of power being required to be dissipated relative to utilizing a static voltage level. In this way, UE 145, 250, 705 and/or eNB 110, 210, 230, 705 performs PAR based power management, thereby improving power consumption of UE 145, 250, 705 and/or eNB 110, 210, 230, 705 relative to utilizing a static voltage level. Moreover, UE 145, 250, 705 and/or eNB 110, 210, 230, 705 may be associated with a reduced hardware requirement and/or computational complexity relative to those devices utilizing an envelope tracking technique.

As indicated above, FIGS. 7A and 7B are provided as an example. Other examples are possible and may differ from what was described with respect to FIGS. 7A and 7B.

Figure 8A:
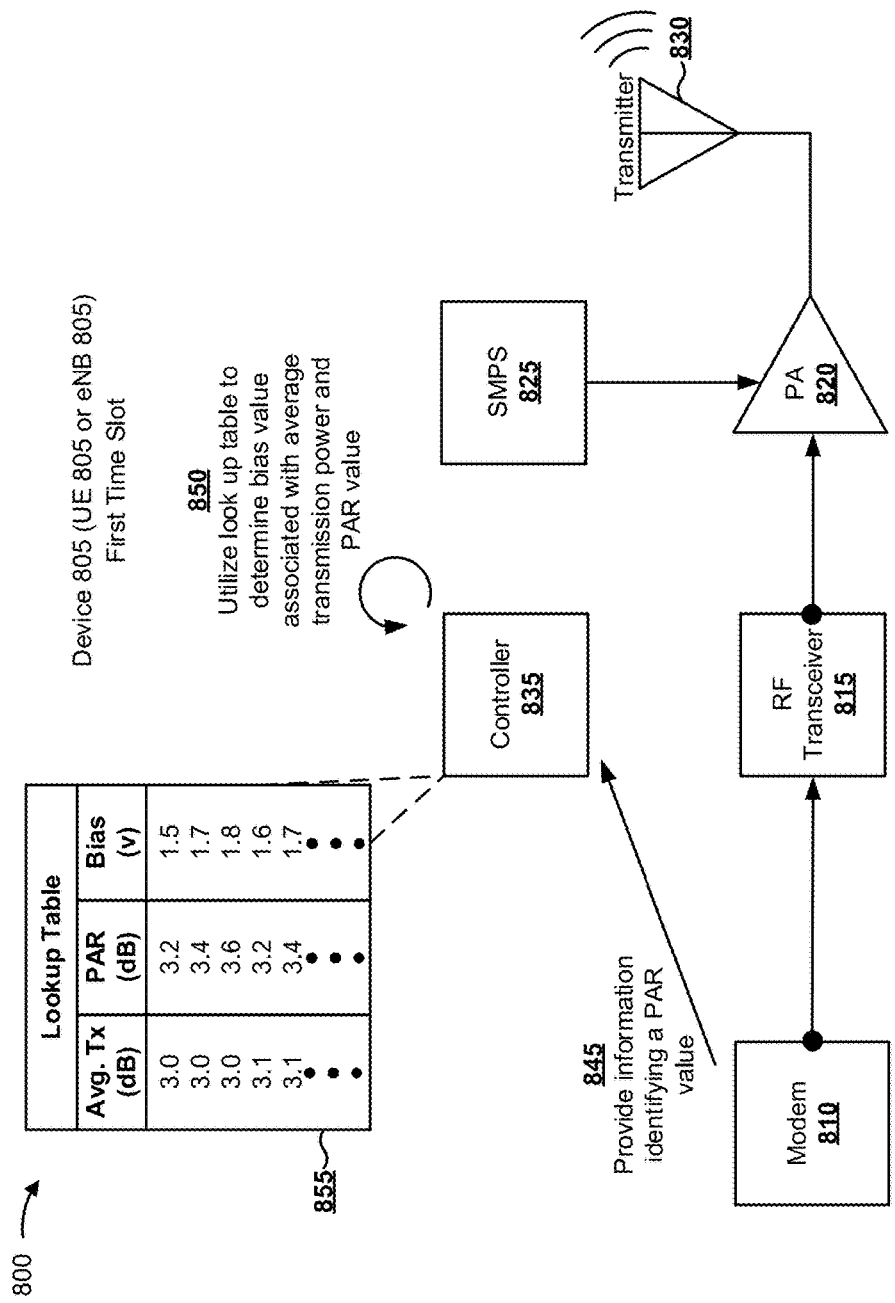
FIGS. 8A and 8B are diagrams of another overview of example aspects described herein, in accordance with various aspects of the present disclosure.
Figure 8B:
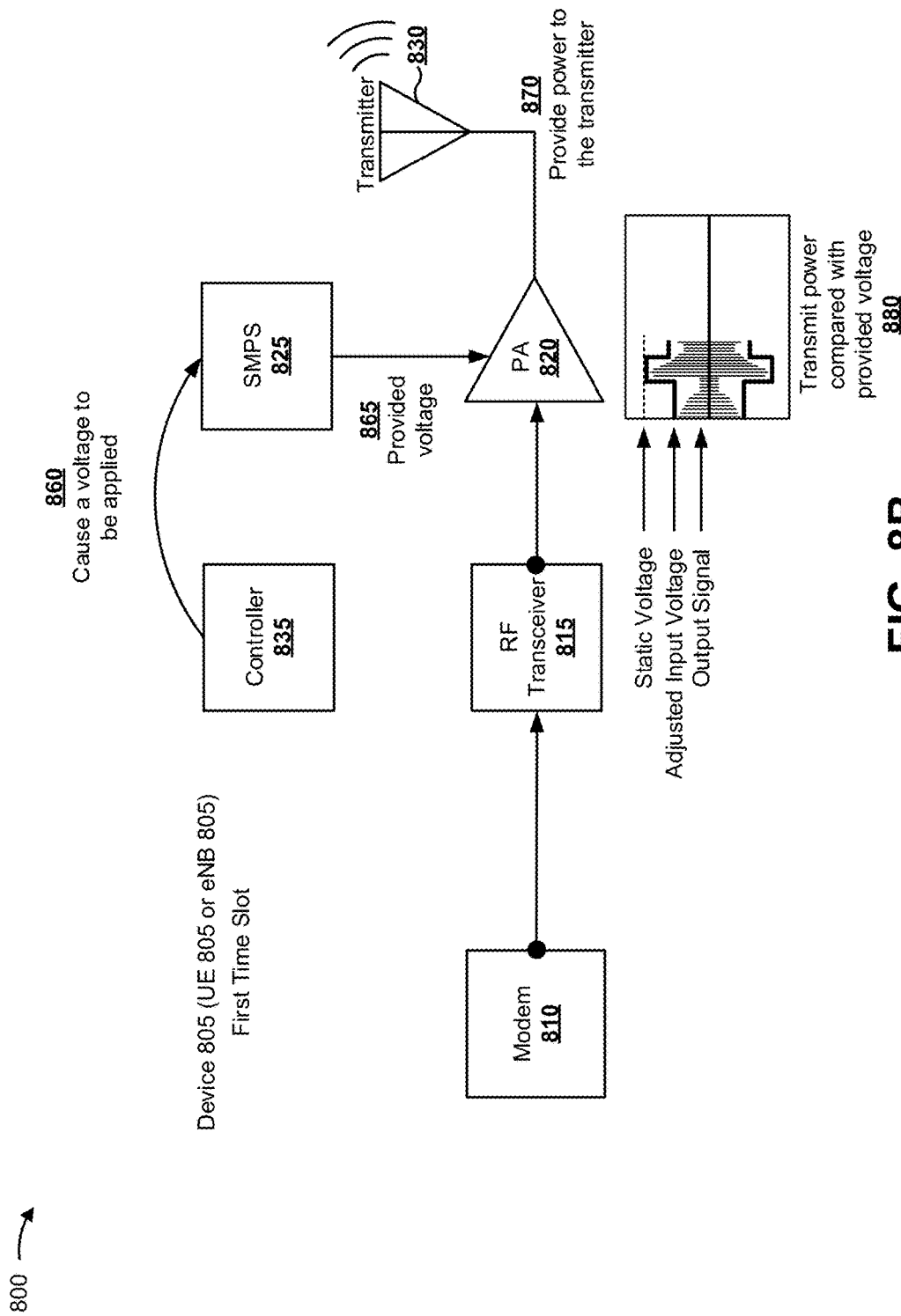

FIGS. 8A and 8B are diagrams illustrating an example 700 of performing PAR based power management, in accordance with various aspects of the present disclosure.

As shown in FIG. 8A, a device 805 (e.g., a UE, such as UE 145, 250, 705, or an eNB, eNB 110, 210, 230, 705) may include a modem 810, an RF transceiver 815, a power amplifier 820, a power supply, such as an SMPS 825, a transmitter 830, and a controller 835. Modem 810 may correspond to modem 710; RF transceiver 815 may correspond to RF transceiver 715; power amplifier 820 may correspond to power amplifier 720; SMPS 825 may correspond to SMPS 725; transmitter 830 may correspond to transmitter 730; and controller 835 may correspond to controller 735.

Data is provided via modem 710, 810 and RF transceiver 715, 815 for power amplification by power amplifier 720, 820. As shown by reference number 845, controller 735, 835 may receive, from modem 710, 810, information identifying a PAR value for a first time slot. In some aspects, controller 735, 835 may obtain the information identifying the PAR value based on the PAR value being determined by, for example, a microkernel. In some aspects, controller 735, 835 may receive information identifying an average transmit power that is to be associated with the first time slot (e.g., one or more portions of the first time slot). As shown by reference number 850, controller 735, 835 may utilize a lookup table 755, 855 to determine a bias value based on the PAR value and/or the average transmit power. The bias value may correspond to a particular voltage that is to be provided as input to power amplifier 720, 820 for the first time slot (e.g., one or more remaining portions of the first time slot).

As shown in FIG. 8B, and by reference number 860, based on the bias value, controller 735, 835 may cause an input voltage to be applied to power amplifier 720, 820 for the first time slot. For example, controller 735, 835 may transmit a control signal to power supply, such as the SMPS 725, 825 to cause the power supply such as the SMPS 725, 825 to provide an input voltage to power amplifier 720, 820 based on the bias value. As shown by reference number 865, based on receiving the control signal from controller 735, 835, SMPS 725, 825 may cause the input voltage to be provided to power amplifier 720, 820 for the first time slot. Based on the input voltage and an input signal from RF transceiver 715, 815, power amplifier 720, 820 generates an output signal for the first time slot.

As further shown in FIG. 8B, and by reference number 870, power amplifier 720, 820 causes the output signal to be transmitted by transmitter 730, 830 based on the provided voltage and based on data received via modem 710, 810 and RF transceiver 715, 815. As shown by reference number 880, a difference between the input voltage and a transmit power for the output signal corresponds to a power dissipation by power amplifier 720, 820 to generate the output signal. In this case, utilizing an adjusted input voltage (e.g., applied to the power amplifier 820 as described above) results in a lesser amount of power being required to be dissipated relative to utilizing a static input voltage level. In this way, UE 145, 250, 705, 805 and/or eNB 110, 210, 230, 705, 805 performs PAR based power management, thereby improving power consumption of UE 145, 250, 705, 805 and/or eNB 110, 210, 230, 705, 805 relative to utilizing the static input voltage level. Moreover, utilization of PAR based power management results in a reduced hardware requirement and/or computational complexity relative to utilizing an envelope tracking based power management procedure.

As indicated above, FIGS. 8A and 8B are provided as an example. Other examples are possible and may differ from what was described with respect to FIGS. 8A and 8B.

Figure 9:
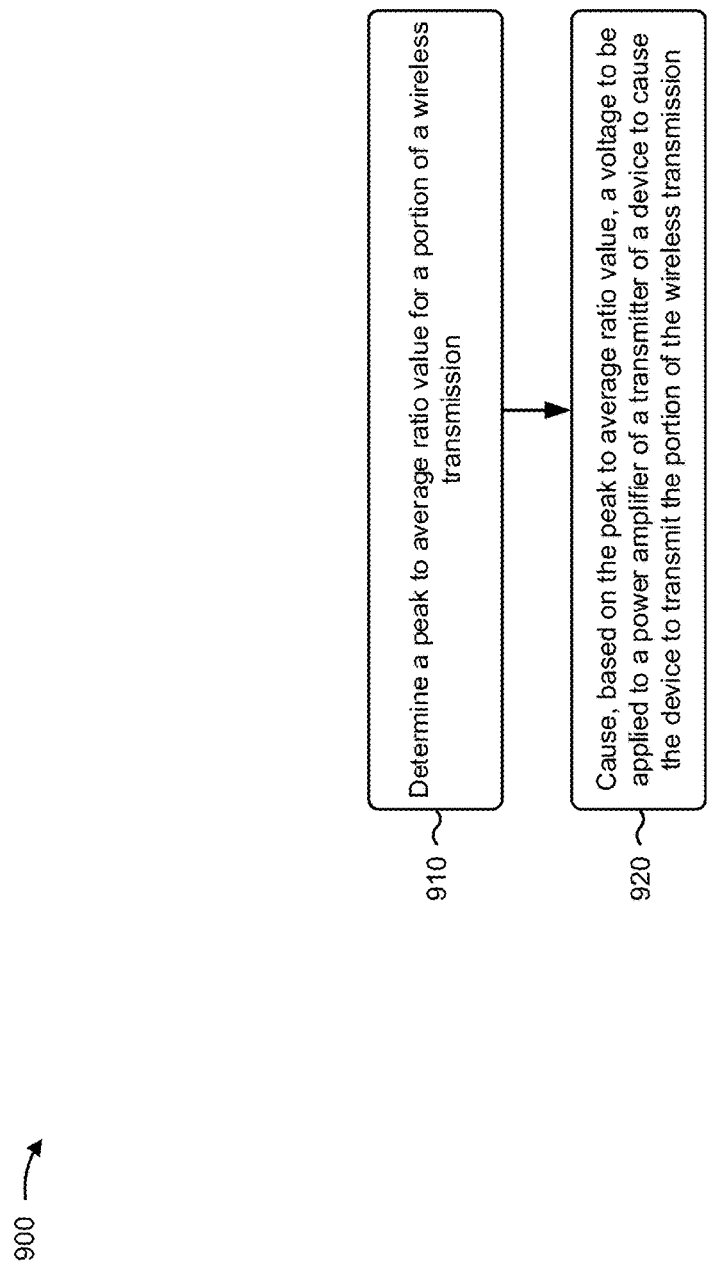
FIG. 9 is a diagram illustrating an example process performed, for example by a device that may correspond to a wireless communication device or a wireless access point, in accordance with various aspects of the present disclosure.

FIG. 9 is a diagram illustrating an example process 900 performed, for example, by a device, which may be a wireless communication device (e.g., a UE 145, 250, 705, 805) or a wireless access point (e.g., an eNB 110, 210, 230, 705, 805), in accordance with various aspects of the present disclosure. Example process 900 is an example where a device performs PAR based power management.

As shown in FIG. 9, in some aspects, process 900 may include determining a PAR value for a portion of a wireless transmission (block 910). For example, a device may determine the PAR value for the portion of the wireless transmission. In some aspects, the device may determine the PAR value using a feedback loop. For example, the device may determine the PAR value based on a measurement of a waveform that is to be transmitted by the device before the waveform is transmitted by the device (e.g., rather than stored information identifying a typical PAR value associated with a particular RAT or receiving a measurement of the waveform after transmission).

In some aspects, the device may determine the PAR value for a particular time slot (e.g., a first time slot) to control a voltage provided to the power amplifier to amplify a signal associated with a subsequent time slot (e.g., a second time slot). For example, a controller of the device may determine the PAR value based on information received from an RF transceiver of the device, information based on an input or output of the RF transceiver of the device, and/or the like.

In some aspects, the device may determine the PAR value for a particular time slot (e.g., a first time slot) to control a voltage provided to a power amplifier to amplify a signal associated with the particular time slot (e.g., the first time slot). For example, a controller of the device may determine (e.g., compute) the PAR value based on receiving information from a modem or microkernel of the device. In this case, the controller of the device may determine the PAR value and cause a voltage to be applied without receiving feedback regarding a transmitted (e.g., transmitted from the transmitter 730 of the device 705, 805) portion of the wireless transmission.

As shown in FIG. 9, in some aspects, process 900 may include causing, based on the PAR value, a voltage to be applied to a power amplifier of a device to cause the device to transmit the portion of the wireless transmission (block 920). For example, the device may cause, based on the PAR value, the voltage to be applied to the power amplifier (e.g., of an RF transmit chain of a transmitter) of the device to cause the device to transmit the portion of the wireless transmission. In some aspects, the device may cause the voltage to be applied based on a bias value associated with the PAR value. For example, the device may utilize stored information identifying a set of bias values that correspond to a set of PAR values, and may select a particular bias value corresponding to the PAR value. In this case, the device may cause a voltage associated with the particular bias value to be provided to the power amplifier.

In some aspects, the device may select the voltage that is caused to be applied further based on an average transmit power value associated with the portion of the wireless transmission. For example, the device may determine the average transmit power value, and may select the bias value based on the PAR value and the average transmit power value using, for example, a lookup table or another type of data structure that associates PAR values and average transmit power values with bias values. In this case, the device may cause the voltage to be applied based on the bias value associated with the average transmit power value.

In some aspects, the device may select the voltage that is caused to be applied based on a power variation metric. The power variation metric may indicate an amount of power variation that may occur from the first time slot to the second time slot. For example, the device may determine a maximum power variation permitted for a waveform from a first time slot to a second time slot based on a type of RAT being utilized, based on a type of signal being transmitted, or the like. In aspects, such a metric may be configured. For example, the device may select a bias value corresponding to the voltage that is to be applied based on the PAR value and the power variation metric, thereby reducing a likelihood that the bias value is associated with an insufficient voltage for power amplification of a signal in the second time slot.

In some aspects, the device may select the voltage that is caused to be applied based on a delta value. The delta value may identify a threshold voltage greater than what is determined to be required for the power amplifier. For example, the device may select the bias value corresponding to the voltage that is to be applied based on the delta value, thereby reducing a likelihood that an error occurs with the power amplification as a result of an insufficient voltage being provided to the power amplifier.

In some aspects, the device may transmit the portion of the wireless communication based on causing the voltage to be applied to the power amplifier. For example, the device may generate an output signal based on the voltage being applied to the power amplifier and an input signal being provided to the power amplifier. In this case, the device may cause the output signal to be transmitted by a transmitter of the device.

In some aspects, the device may adjust the bias value for a single RAT. For example, the device may select the bias value based on a first PAR value associated with a transmission using an LTE RAT at a first slot, and may subsequently adjust the bias value based on a second PAR value associated with another transmission using the LTE RAT at a second time slot. In this way, the device improves power consumption during transmission using a single RAT with varying PAR values.

Additionally, or alternatively, process 900 may include determining an average transmit power value associated with the portion of the wireless transmission and process 900 may include selecting the voltage based on the PAR value and the average transmit power value.

Additionally, or alternatively, process 900 may include transmitting the portion of the wireless transmission based on causing the voltage to be applied to the power amplifier (e.g., of an RF transmitter) of the device.

Additionally, or alternatively, process 900 may include obtaining the PAR value from at least one of a transceiver of the device or a modem of the device.

Additionally, or alternatively, process 900 may include controlling a switched mode power supply to cause the voltage to be applied to the power amplifier.

Additionally, or alternatively, process 900 may include causing the voltage to be applied based on a bias value associated with the PAR value, where the bias value may be selected based on the PAR value.

Additionally, or alternatively, process 900 may include selecting the bias value based on information stored in a data structure, where the data structure may store a set of bias values associated with a set of PAR values.

Additionally, or alternatively, where the PAR value is associated with a first time slot, process 900 may include determining a power variation metric for a second time slot, the first time slot may be immediately preceding the second time slot, and process 900 may include selecting the bias value for the second time slot based on the PAR value associated with the first time slot and the power variation metric for the second time slot.

Additionally, or alternatively, process 900 may include selecting a bias value for the particular time slot (e.g., one or more remaining portions of a time slot) based on the PAR value associated with the particular time slot (e.g., one or more previous portions of the time slot).

Additionally, or alternatively, the portion of the wireless transmission may be associated with a transmit power of less than approximately 20 decibels.

Additionally, or alternatively, the portion of the wireless transmission may be a signaling transmission for the device.

Additionally, or alternatively, causing the voltage to be applied to the power amplifier (e.g., of the transmitter of the device as part of transmitting the portion of the wireless transmission from the device) may not be based on feedback regarding one or more transmitted (e.g., transmitted from the device) portions of the wireless transmission.

For example, although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
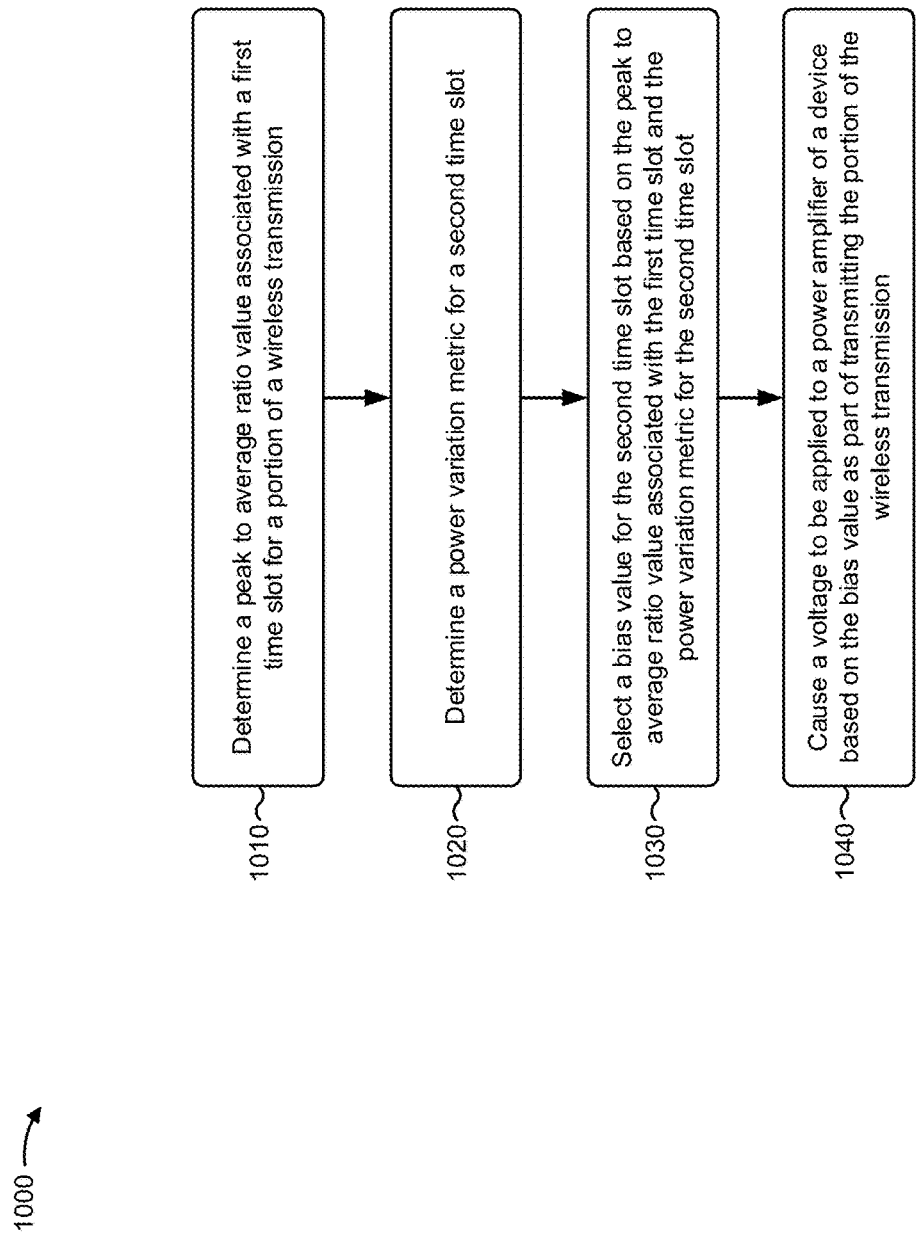
FIG. 10 is a diagram illustrating another example process performed, for example by a device that may correspond to a wireless communication device or a wireless access point, in accordance with various aspects of the present disclosure.

FIG. 10 is a diagram illustrating an example process 1000 performed, for example, by a device, which may be a wireless communication device (e.g., a UE 145, 250, 705, 805) or a wireless access point (e.g., an eNB 110, 210, 230, 705, 805), in accordance with various aspects of the present disclosure. Example process 1000 is an example where a device performs PAR based power management.

As shown in FIG. 10, in some aspects, process 1000 may include determining a PAR value associated with a first time slot for a portion of a wireless transmission (block 1010). For example, a device may determine the PAR value associated with the first time slot for the portion of the wireless transmission. In some aspects, the device may determine the PAR value based on information received from an RF transceiver (e.g., or an input or output thereof) of the device.

As shown in FIG. 10, in some aspects, process 1000 may include determining a power variation metric for a second time slot (block 1020). For example, the device may determine the power variation metric for the second time slot. The power variation metric may refer to a maximum power variation between an input signal to a power amplifier of the device for the first time slot and an input signal to the power amplifier of the device for the second time slot. In some aspects, the device may determine the power variation metric based on stored information. For example, the device may store information identifying a maximum power variation for a set of time slots, and may access the stored information to determine the power variation metric. In some aspects, the device may determine a delta value associated with the power variation metric. For example, the device may determine that for a power variation metric of 1.5 decibels (dB), a delta of 0.2 dB is to be utilized to reduce a likelihood that an error occurs in a wireless transmission resulting from an insufficient voltage being provided to a power amplifier of the device.

As shown in FIG. 10, in some aspects, process 1000 may include selecting a bias value for the second time slot based on the PAR value associated with the first time slot and the power variation metric for the second time slot (block 1030). For example, the device may select the bias value for the second time slot based on the PAR value associated with the first time slot and the power variation metric for the second time slot. In some aspects, the device may select the bias value based on stored information. For example, the device may utilize a lookup table or another data structure that stores information identifying a set of bias values associated with a set of PAR values, a set of power variation metric values, a set of delta values, and/or the like, and may select the bias value from the set of bias values based on the PAR value, the power variation metric, and/or the delta value.

As shown in FIG. 10, in some aspects, process 1000 may include causing a voltage to be applied to a power amplifier of a device based on the bias value as part of transmitting the portion of the wireless transmission (block 1040). For example, the device may cause the voltage, selected based on the bias value, to be applied to the power amplifier of the transmitter of the device to cause the device to transmit the portion of the wireless transmission. In this case, the device may transmit an output signal corresponding to the second time slot based on causing the voltage associated with the bias value to be applied to the power amplifier.

Additionally, or alternatively, process 1000 may include determining an average transmit power value associated with the portion of the wireless transmission and selecting the bias value based on the PAR value and the average transmit power value.

Additionally, or alternatively, process 1000 may include transmitting the portion of the wireless transmission based on causing the voltage to be applied to the power amplifier of the device.

Additionally, or alternatively, process 1000 may include obtaining the PAR value from at least one of a transceiver of the device or a modem of the device.

Additionally, or alternatively, process 1000 may include controlling a switched mode power supply to cause the voltage to be applied to the power amplifier.

Additionally, or alternatively, process 1000 may include determining the PAR value based on information received using a feedback loop.

Additionally, or alternatively, process 1000 may include selecting the bias value based on information stored in a data structure, where the data structure stores a set of bias values associated with a set of PAR values.

Additionally, or alternatively, the portion of the wireless transmission may be associated with a transmit power of less than approximately 20 decibels.

Additionally, or alternatively, the portion of the wireless transmission may be a signaling transmission for the device.

Although FIG. 10 shows example blocks of process 1000, in some aspects, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
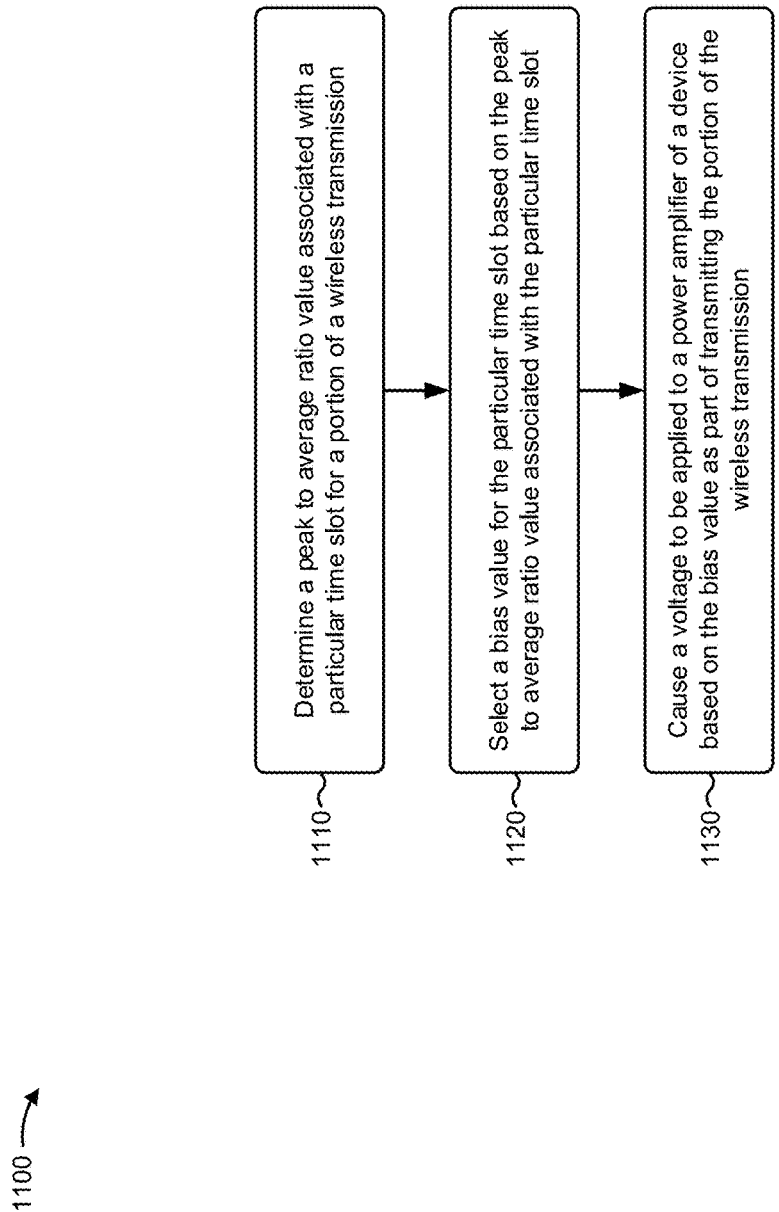
FIG. 11 is a diagram illustrating another example process performed, for example by a device that may correspond to a wireless communication device or a wireless access point, in accordance with various aspects of the present disclosure.

FIG. 11 is a diagram illustrating an example process 1100 performed, for example, by a device, which may be a wireless communication device (e.g., a UE 145, 250, 705, 805) or a wireless access point (e.g., an eNB 110, 210, 230, 705, 805), in accordance with various aspects of the present disclosure. Example process 1100 is an example where a device performs PAR based power management.

As shown in FIG. 11, in some aspects, process 1100 may include determining a PAR value associated with a particular time slot for a portion of a wireless transmission (block 1110). For example, a device may determine the PAR value associated with the particular time slot for the portion of the wireless transmission. In some aspects, the device may determine the PAR value based on receiving information from a modem of the device. For example, the modem of the device may perform a PAR value determination, and may provide an indication of the PAR value to a controller of the device for utilization in selecting a bias value. In some aspects, the device may determine the PAR value based on a computation performed by a microkernel of the device.

As shown in FIG. 11, in some aspects, process 1100 may include selecting a bias value for the particular time slot based on the PAR value associated with the particular time slot (block 1120). For example, the device may select the bias value for the particular time slot based on the PAR value associated with the particular time slot. In some aspects, the device may select the bias value based on information stored via a data structure. For example, the device may obtain a bias value from a data structure storing information identifying a set of bias values corresponding to a set of PAR values, a set of average transmit powers, and/or the like. In some aspects, the device may select the bias value for the particular time slot for which the PAR value is determined.

As shown in FIG. 11, in some aspects, process 1100 may include causing a voltage to be applied to a power amplifier of a device based on the bias value as part of transmitting the portion of the wireless transmission (block 1130). For example, the device may cause the voltage, selected based on the bias value, to be applied to the power amplifier of the transmitter to cause the device to transmit the portion of the wireless transmission. In some aspects, the device may cause the voltage to be provided to the power amplifier to cause the power amplifier to provide an output signal corresponding to the particular time slot.

Additionally, or alternatively, process 1100 may include determining an average transmit power value associated with the portion of the wireless transmission and selecting the bias value based on the PAR value and the average transmit power value.

Additionally, or alternatively, process 1100 may include transmitting the portion of the wireless transmission based on causing the voltage to be applied to the power amplifier of the device.

Additionally, or alternatively, process 1100 may include obtaining the PAR value from at least one of a transceiver of the device or a modem of the device.

Additionally, or alternatively, process 1100 may include controlling a switched mode power supply to cause the voltage to be applied to the power amplifier.

Additionally, or alternatively, process 1100 may include determining the PAR value based on information received using a feedback loop.

Additionally, or alternatively, process 1100 may include selecting the bias value based on information stored in a data structure, where the data structure may store a set of bias values associated with a set of PAR values.

Additionally, or alternatively, the portion of the wireless transmission may be associated with a transmit power of less than approximately 20 decibels.

Additionally, or alternatively, the portion of the wireless transmission may be a signaling transmission for the device.

Additionally, or alternatively, process 1100 may include not causing the voltage to be applied based on feedback regarding one or more transmitted portions of the wireless transmission.

Although FIG. 11 shows example blocks of process 1100, in some aspects, process 1100 may include additional blocks, fewer blocks, different blocks, or differently arranged blocks than those depicted in FIG. 11. Additionally, or alternatively, two or more of the blocks of process 1100 may be performed in parallel.

Techniques and apparatuses described herein may cause a device, which may include a wireless communication device or an access point, to determine a PAR value associated with a portion of a wireless transmission and adjust a voltage applied to a power amplifier based on the PAR value. This may improve a power consumption of the device relative to providing a static voltage to the power amplifier. Moreover, the device may reduce a cost and/or a size of the device based on obviating the need for a digital to analog converter associated with performing an envelope tracking based power management procedure.

The foregoing disclosure provides illustration and description, but is not intended to be exhaustive or to limit the aspects to the precise form disclosed. Modifications and variations are possible in light of the above disclosure or may be acquired from practice of the aspects.

As used herein, the term component is intended to be broadly construed as hardware, firmware, or a combination of hardware and software. As used herein, a processor is implemented in hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods, described herein, may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of possible aspects. In fact, many of these features may be combined in ways not specifically recited in the claims and/or disclosed in the specification. Although each dependent claim listed below may directly depend on only one claim, the disclosure of possible aspects includes each dependent claim in combination with every other claim in the claim set. A phrase referring to "at least one of" a list of items refers to any combination of those items, including single members. For example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean, "based, at least in part, on" unless explicitly stated otherwise.

What is claimed is:

1. A method of wireless communications, comprising:
determining, by a device, a peak to average ratio (PAR) value for a portion of a wireless transmission associated with a first time slot;
determining, by the device, a power variation metric for a second time slot,
the first time slot preceding the second time slot;
selecting, by the device, a bias value for the second time slot based on the PAR value associated with the first time slot and the power variation metric for the second time slot; and
causing, by the device, a voltage to be applied to a power amplifier of the device based on the bias value as part of transmitting the portion of the wireless transmission.

2. The method of claim 1, further comprising:
determining an average transmit power value associated with the portion of the wireless transmission; and
wherein selecting the bias value includes selecting the bias value based on the PAR value and the average transmit power value.

3. The method of claim 1, further comprising:
transmitting the portion of the wireless transmission based on causing the voltage to be applied to the power amplifier of the device.

4. The method of claim 1, further comprising:
obtaining the PAR value from at least one of a transceiver of the device or a modem of the device.

5. The method of claim 1, further comprising:
controlling a switched mode power supply to cause the voltage to be applied to the power amplifier.

6. The method of claim 1, further comprising:
determining the PAR value based on information received using a feedback loop.

7. The method of claim 1, wherein selecting the bias value includes selecting the bias value based on information stored in a data structure,
the data structure storing a set of bias values associated with a set of PAR values.

8. The method of claim 1, wherein the portion of the wireless transmission is associated with a transmit power of less than approximately 20 decibels.

9. The method of claim 1, wherein the portion of the wireless transmission is a signaling transmission for the device.

10. A device, comprising:
one or more processors configured to:
determine a peak to average ratio (PAR) value for a portion of a wireless transmission associated with a first time slot;
determine a power variation metric for a second time slot,
the first time slot preceding the second time slot;
select a bias value for the second time slot based on the PAR value associated with the first time slot and the power variation metric for the second time slot; and
cause a voltage to be applied to a power amplifier of the device based on the bias value as part of transmitting the portion of the wireless transmission.

11. The device of claim 10, wherein the one or more processors are further configured to:
determine an average transmit power value associated with the portion of the wireless transmission; and
wherein the one or more processors, when selecting the bias value, are configured to select the bias value based on the PAR value and the average transmit power value.

12. The device of claim 10, wherein the one or more processors are further configured to:
transmit the portion of the wireless transmission based on causing the voltage to be applied to the power amplifier of the device.

13. The device of claim 10, wherein the one or more processors are further configured to:
obtain the PAR value from at least one of a transceiver of the device or a modem of the device.

14. The device of claim 10, wherein the one or more processors are further configured to:
control a switched mode power supply to cause the voltage to be applied to the power amplifier.

15. A non-transitory computer-readable medium storing instructions for wireless communication, the instructions comprising:
one or more instructions that, when executed by one or more processors of a device, cause the one or more processors to:
determine a peak to average ratio (PAR) value associated with a first time slot for a portion of a wireless transmission;
determine a power variation metric for a second time slot,
the first time slot preceding the second time slot;
select a bias value for the second time slot based on the PAR value associated with the first time slot and the power variation metric for the second time slot; and
cause a voltage to be applied to a power amplifier of the device based on the bias value as part of transmitting the portion of the wireless transmission.

16. The non-transitory computer-readable medium of claim 15, where the one or more instructions, when executed by the one or more processors, further cause the one or more processors to:
determine an average transmit power value associated with the portion of the wireless transmission; and
wherein the one or more instructions, that cause the one or more processors to select the bias value, cause the one or more processors to select the bias value based on the PAR value and the average transmit power value.

17. The non-transitory computer-readable medium of claim 15, where the one or more instructions, when executed by the one or more processors, further cause the one or more processors to:
  transmit the portion of the wireless transmission based on causing the voltage to be applied to the power amplifier of the device.

18. The non-transitory computer-readable medium of claim 15, where the one or more instructions, when executed by the one or more processors, further cause the one or more processors to:
  obtain the PAR value from at least one of a transceiver of the device or a modem of the device.

19. The non-transitory computer-readable medium of claim 15, where the one or more instructions, when executed by the one or more processors, further cause the one or more processors to:
  control a switched mode power supply to cause the voltage to be applied to the power amplifier.

20. The non-transitory computer-readable medium of claim 15, where the one or more instructions, when executed by the one or more processors, further cause the one or more processors to:
  determine the PAR value based on information received using a feedback loop.

21. The non-transitory computer-readable medium of claim 15, where the one or more instructions, when executed by the one or more processors, further cause the one or more processors to:
  select the bias value based on information stored in a data structure,
    the data structure storing a set of bias values associated with a set of PAR values.

22. The non-transitory computer-readable medium of claim 15, wherein the portion of the wireless transmission is associated with a transmit power of less than approximately 20 decibels.

23. The non-transitory computer-readable medium of claim 15, wherein the portion of the wireless transmission is a signaling transmission for the device.

24. The non-transitory computer-readable medium of claim 15, wherein the one or more instructions, that cause the voltage to be applied to the power amplifier of the device to cause the device to transmit the portion of the wireless transmission, are configured not to cause the voltage to be applied based on feedback regarding one or more transmitted portions of the wireless transmission.

25. An apparatus for wireless communications, comprising:
  means for determining a peak to average ratio (PAR) value associated with a first time slot for a portion of a wireless transmission;
  means for determining a power variation metric for a second time slot,
    the first time slot preceding the second time slot;
  means for selecting a bias value for the second time slot based on the PAR value associated with the first time slot and the power variation metric for the second time slot; and
  means for causing a voltage to be applied to a power amplifier of the apparatus based on the bias value as part of transmitting the portion of the wireless transmission.

26. The apparatus of claim 25, further comprising:
means for determining an average transmit power value associated with the portion of the wireless transmission; and
wherein the means for selecting the bias value includes means for selecting the bias value based on the PAR value and the average transmit power value.

27. The apparatus of claim 25, further comprising:
means for transmitting the portion of the wireless transmission based on causing the voltage to be applied to the power amplifier of the apparatus.

28. The apparatus of claim 25, further comprising:
means for obtaining the PAR value from at least one of a transceiver of the apparatus or a modem of the apparatus.

29. The apparatus of claim 25, further comprising:
means for controlling a switched mode power supply to cause the voltage to be applied to the power amplifier.

30. The apparatus of claim 25, further comprising:
means for determining the PAR value based on information received using a feedback loop.

* * * * *